(12) United States Patent
Kawamorita et al.

(10) Patent No.: US 10,550,471 B2
(45) Date of Patent: Feb. 4, 2020

(54) MIXED GAS MULTIPLE LINE SUPPLY SYSTEM AND SUBSTRATE PROCESSING APPARATUS USING SAME

(71) Applicant: TOKYO ELECTRON LIMITED, Tokyo (JP)

(72) Inventors: Shinobu Kawamorita, Iwate (JP); Satoru Koike, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 324 days.

(21) Appl. No.: 15/446,512

(22) Filed: Mar. 1, 2017

(65) Prior Publication Data

US 2017/0253971 A1 Sep. 7, 2017

(30) Foreign Application Priority Data

Mar. 4, 2016 (JP) .................. 2016-042022

(51) Int. Cl.
*C23C 16/455* (2006.01)
*C23C 16/52* (2006.01)
*C23C 16/458* (2006.01)

(52) U.S. Cl.
CPC .... *C23C 16/45561* (2013.01); *C23C 16/4583* (2013.01); *C23C 16/4584* (2013.01); *C23C 16/45551* (2013.01); *C23C 16/45574* (2013.01); *C23C 16/45578* (2013.01); *C23C 16/45589* (2013.01); *C23C 16/52* (2013.01)

(58) Field of Classification Search
CPC ............................... C23C 16/45561
See application file for complete search history.

(56) References Cited

U.S. PATENT DOCUMENTS

2004/0099213 A1* 5/2004 Adomaitis .......... C23C 16/4412
118/715

FOREIGN PATENT DOCUMENTS

| JP | 2009-117477 A | 5/2009 |
| JP | 2013-093514 A | 5/2013 |
| TW | 200737314 A | 2/1996 |
| WO | 2011/074604 A1 | 6/2011 |

* cited by examiner

*Primary Examiner* — Joseph A Miller, Jr.
(74) *Attorney, Agent, or Firm* — Nath, Goldberg & Meyer; Jerald L. Meyer

(57) ABSTRACT

A mixed gas multiple line supply system includes a flow splitter connected to a common mixed gas supplying passage, the flow splitter configured to split a mixed gas into a plurality of supply lines while adjusting a ratio of flow rates in the plurality of supply lines, and an least one injector including a gas introducing port and a gas discharge hole for each of a plurality of regions in the processing container and configured to supply the mixed gas to each of the plurality of regions. The plurality of supply lines of the flow splitter are connected in one-to-one correspondence to the respective gas introducing ports provided for the plurality of regions in the processing container.

10 Claims, 18 Drawing Sheets

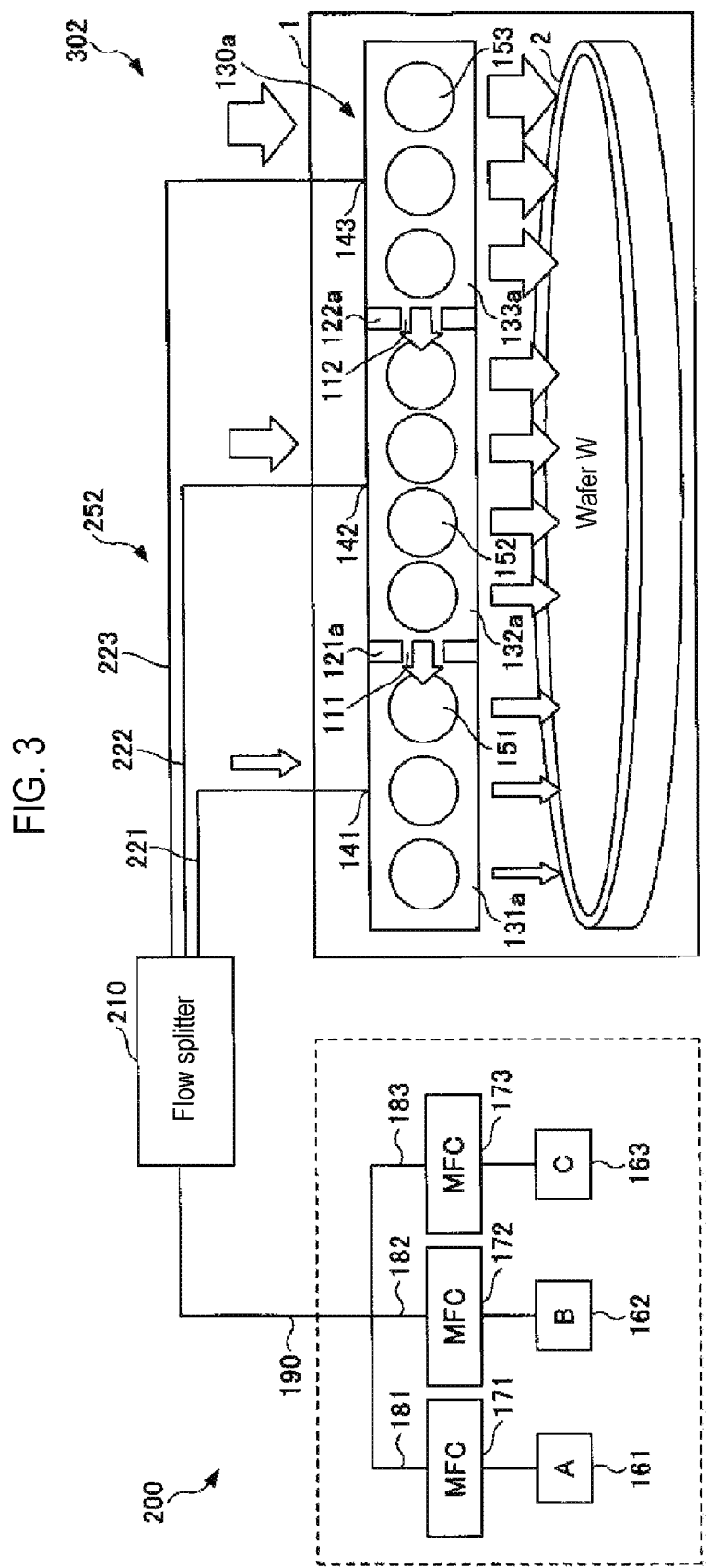

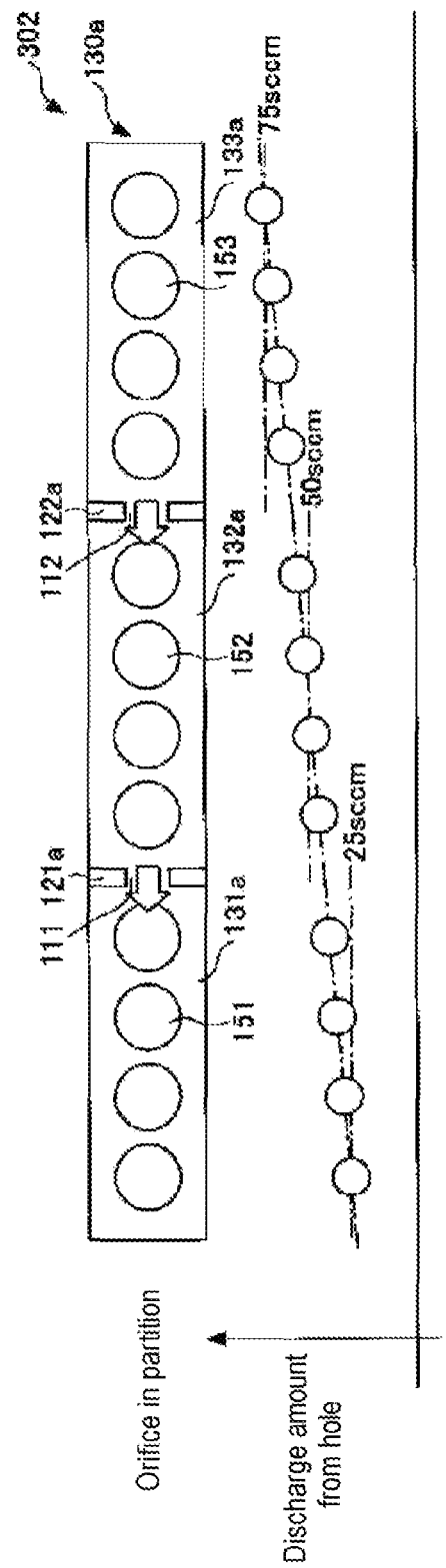

MIXED GAS MULTIPLE LINE SUPPLY SYSTEM AND SUBSTRATE PROCESSING APPARATUS USING SAME

CROSS-REFERENCE TO RELATED APPLICATION

This application claims the benefit of Japanese Patent Application No. 2016-042022, filed on Mar. 4, 2016, in the Japan Patent Office, the disclosure of which is incorporated herein in its entirety by reference.

TECHNICAL FIELD

The present disclosure relates to a mixed gas multiple line supply system and a substrate processing apparatus using the same.

BACKGROUND

Conventionally, there has been known a vapor deposition apparatus including a susceptor on which a target substrate is mounted, a gas supplying part configured to face the susceptor and to supply a plurality of material gases to the target substrate, a plurality of mixing pipes configured to mix a plurality of predetermined material gases among the plurality of material gases and to introduce the mixed gases into the gas supplying part, respectively, and a plurality of gas branch mechanisms configured to cause the plurality of material gases to be separated from one another while adjusting a flow rate of each of the material gases and to supply each of the separated material gases to any one of the plurality of mixing pipes, wherein the gas supplying part sprays a plurality of mixed gases mixed in the plurality of respective mixing pipes to a plurality of regions on the susceptor, respectively, and, in each of the plurality of mixed gases, each of the plurality of predetermined material gases is adjusted in terms of a concentration and a flow rate thereof.

In this vapor deposition apparatus, supply lines are branched off from each of gas supply sources by the gas branch mechanisms and the branched supply lines for gases are connected to the plurality of mixing pipes, respectively, so that a plurality of mixing pipes which supplies an identical mixed gas is provided and each of them sprays the mixed gas to a respective place of the plurality of regions on the susceptor.

In this configuration, however, the same number of mixing pipes, which is configured to supply the identical mixed gas, as the number of the regions on the susceptor is required. Accordingly, there are problems in that the apparatus has a complicated configuration and thus also becomes bulky as the number of the pipes is increased.

In particular, in the aforementioned configuration, there are problems in that, since an increase in the number of the mixing pipes results in a further need for an increase in the number of branch lines from each of gas sources, an increase in the number of the regions on the susceptor to which the mixed gases are supplied causes a remarkable increase in the number of pipes in the vicinity of the gas sources.

Recently, since the kinds of gases used for the substrate processing and the number of the regions on the susceptor tend to be increased from the viewpoint of improvement of in-plane uniformity, an increase in the number of pipes and enlargement of the apparatus becomes problematic.

SUMMARY

Some embodiments of the present disclosure provide a mixed gas multiple line supply system capable of achieving miniaturization of an apparatus by reducing the number of pipes when a mixed gas is separated into multiple lines and then supplied to a plurality of regions in a processing container, and a substrate processing apparatus using the same.

According to one embodiment of the present disclosure, there is provided a mixed gas multiple line supply system, including: a flow splitter connected to a common mixed gas supplying passage, the flow splitter configured to split a mixed gas into a plurality of supply lines while adjusting a ratio of flow rates in the plurality of supply lines; and an least one injector including a gas introducing port and a gas discharge hole for each of a plurality of regions in the processing container and configured to supply the mixed gas to each of the plurality of regions, wherein the plurality of supply lines of the flow splitter are connected in one-to-one correspondence to the respective gas introducing ports provided for the plurality of regions in the processing container.

According to another embodiment of the present disclosure, there is provided a substrate processing apparatus, including: the mixed gas multiple line supply system described above; a processing container; and a wafer holding unit configured to hold a wafer in the processing container.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a view illustrating examples of a mixed gas multiple line supply system and a substrate processing apparatus according to a third embodiment of the present disclosure.

FIGS. 4A and 4B are views illustrating a difference between a distribution of a discharge amount in the mixed gas multiple line supply system and the substrate processing apparatus according to the second embodiment and a distribution of a discharge amount in the mixed gas multiple line supply system and the substrate processing apparatus according to the third embodiment of the present disclosure, wherein FIG. 4A is a view showing the discharge amount distribution of a mixed gas discharged from an injector of the mixed gas multiple line supply system and the substrate processing apparatus according to the second embodiment and FIG. 4B is a view showing the discharge amount distribution of a mixed gas discharged from an injector of the mixed gas multiple line supply system and the substrate processing apparatus according to the third embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<First Embodiment>

Figure 1:
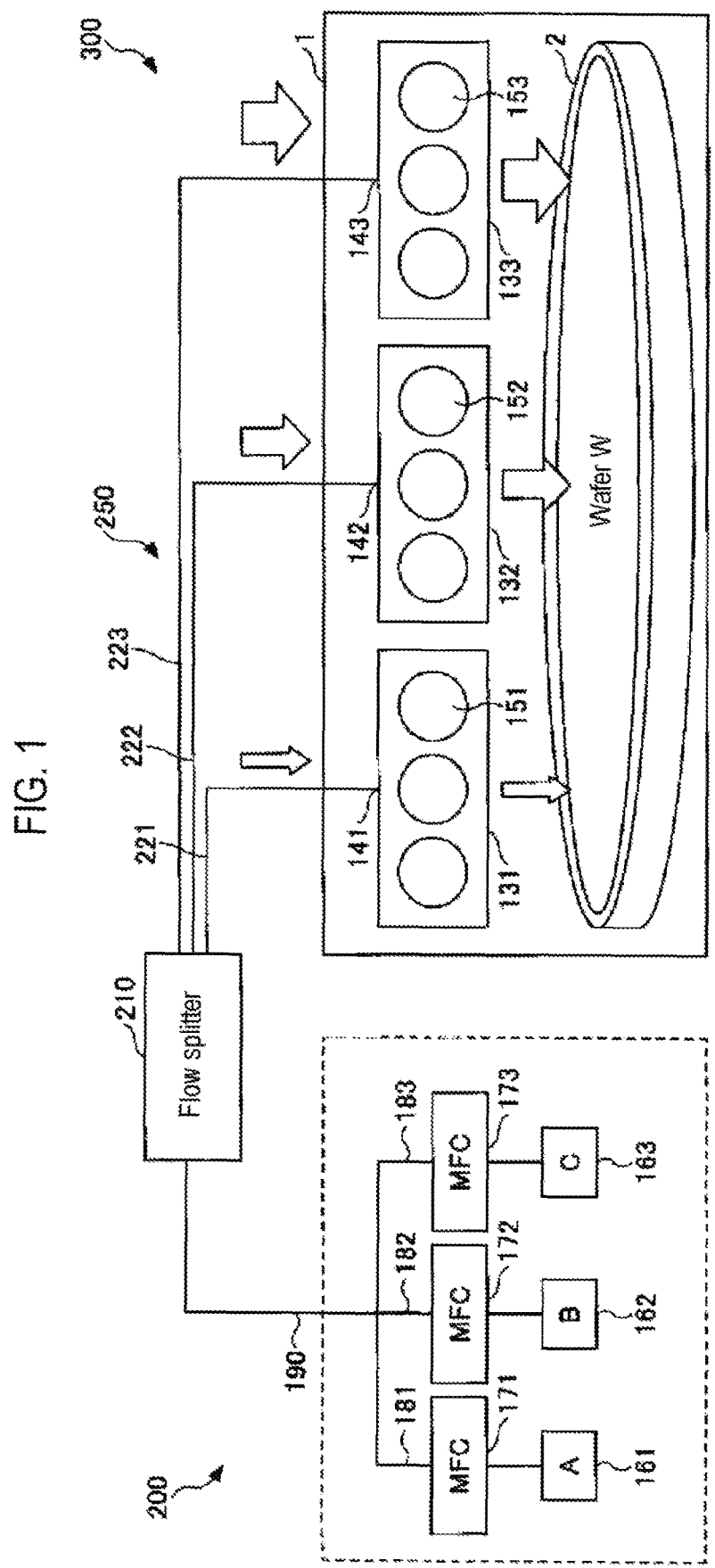
FIG. 1 is a view illustrating examples of a mixed gas multiple line supply system and a substrate processing apparatus according to a first embodiment of the present disclosure.

FIG. 1 is a view illustrating an example of a mixed gas multiple line supply system 250 and a substrate processing apparatus according to a first embodiment of the present disclosure. In FIG. 1, there are shown the mixed gas multiple line supply system 250 and the substrate processing apparatus 300 including the same.

The mixed gas multiple line supply system 250 includes a mixed gas generating part 200, a flow splitter 210, branch pipes 221 to 223 and injectors 131 to 133. In addition, the substrate processing apparatus 300 has a processing container 1 and a rotary table 2.

The mixed gas multiple line supply system 250 is a system configured to generate a mixed gas, to split the generated mixed gas into multiple lines and to supply the split mixed gas to a plurality of regions in the processing container 1 using the injectors 131 to 133.

In FIG. 1, the flow splitter 210 is connected to the mixed gas generating part 200, and the generated mixed gas is supplied from the flow splitter 210 to the injectors 131 to 133 via the branch pipes 221 to 223.

The mixed gas generating part 200 is a unit configured to mix a plurality of process gases to generate the mixed gas. The mixed gas generating part 200 includes gas supply sources 161 to 163, flow rate controllers 171 to 173, individual pipes 181 to 183 and a mixing pipe 190.

The gas supply sources 161 to 163 are units configured to supply respective gases constituting the mixed gas. Each of the gas supply sources may be formed of a tank containing the gas, and may have a unit such as a vaporizer to generate the gas, if necessary. The plurality of gas supply sources 161 to 163 which corresponds to the kinds of gases constituting the mixed gas, is provided.

Each of the flow rate controllers 171 to 173 is a unit configured to adjust a flow rate of a gas and is configured by, for example, a mass flow controller and the like. The flow rate controllers 171 to 173 are also provided to correspond to the kinds of gases constituting the mixed gas. Thus, the flow rate controllers 171 to 173 are provided to the gas supply sources 161 to 163 in one-to-one correspondence. With this configuration, the flow rate of each of the gases can be accurately set and adjusted. In FIG. 1, three (3) kinds of gases are employed as components of the mixed gas and three (3) gas supply sources 161 to 163 and three (3) flow rate controllers 171 to 173 are installed.

The individual pipes 181 to 183 are pipes configured to connect the flow rate controllers 171 to 173 to the mixing pipe 190, respectively, and are installed in one-to-one correspondence to the kinds of gases constituting the mixed gas. Therefore, like the flow rate controllers 171 to 173, three (3) individual pipes 181 to 183 are installed as shown in FIG. 1.

The mixing pipe 190 is a pipe configured to mix the plurality of gases supplied from the individual pipes 181 to 183 to generate the mixed gas. Therefore, only one mixing pipe 190 is provided, and the respective gases supplied from the individual pipes 181 to 183 are mixed in the mixing pipe 190.

The flow splitter 210 is a flow-splitting unit configured to split the mixed gas supplied from the mixing pipe 190 into multiple lines. At this time, the flow splitter 210 can set a ratio of flow rates of the mixed gases to a predetermined value. Therefore, the flow splitter 210 supplies the mixed gas to the branch pipes 221 and 223 while adjusting the ratio of the flow rates of the mixed gases to the predetermined value.

The branch pipes 221 to 223 are units configured to supply the mixed gas to the injectors 131 to 133 at the predetermined ratio of the respective flow rates. The branch pipes 221 to 223 are connected to gas introducing ports 141 to 143 of the injectors 131 to 133, respectively.

The injectors 131 to 133 are units configured to supply the mixed gas to the plurality of regions in the processing container 1. The injectors 131 to 133 are configured, for example, in the form of a nozzle. The nozzle may be in a shape of a cylinder or a polygonal column such as a square column Therefore, the injectors 131 to 133 may be referred to as gas nozzles 131 to 133.

In order to supply the mixed gas to the plurality of regions in the processing container 1 or to a plurality of regions on a wafer W, each of the injector 131 to 133 is installed to each of the plurality of regions in the processing container 1 in a one-to-one correspondence basis. Therefore, a plurality of injectors 131 to 133 are installed as a whole. Each of the plurality of injectors 131 to 133 has one gas introducing port 141, 142 or 143 and at least one gas discharge hole 151, 152 or 153. Commonly, a plurality of gas discharge holes 151 to 153 are provided in each of the regions. An example in which three (3) gas discharge holes are provided in each of the injectors 131 to 133 is schematically shown in FIG. 1. Actually, in many cases, several tens of gas discharge holes are provided in each of the injectors 131 to 133. Since the gas discharge holes 151 to 153 are provided in plural places, diameters or positions of the holes can be adjusted in various manners. In addition, it is also possible to supply the mixed gas such that the mixed gas can be uniformly spread in each of the plurality of regions to which each of the injectors 131 to 133 supplies the mixed gas. Therefore, it is preferable that each of the injectors 131 to 133 has the plurality of gas discharge holes 151 to 153.

The plurality of injectors 131 to 133 are provided to the plurality of branch pipes 221 to 223 of the multiple lines split by the flow splitter 220. Since the flow splitter 210 can adjust the ratio of the flow rates in the multiple lines as described above, it is possible to adjust a ratio of flow rates in the injectors 131 to 133.

In FIG. 1, the plurality of injectors 131 to 133 are provided in different regions in the processing container 1, respectively, so as to supply the mixed gas to different regions on the wafer W. There may a certain case where, due to the configuration of the substrate processing apparatus 300 including the processing container 1 and the like, the substrate processing to a specific region of the wafer W may be insufficiently or excessively performed. In such a case, by properly setting the ratio of the flow rates of the mixed gas, excess or shortage of the substrate processing can be cured and the substrate processing with higher uniformity over the entire surface of the wafer W can be performed. Moreover, as described above, by adjusting the diameters or positions of the gas discharge holes 151 to 153 as well as the ratio of the flow rates, it is possible to perform substrate processing with improved in-plane uniformity. Furthermore, FIG. 1 schematically represents an extent of difference in the supply flow rates using arrows and shows an example in which the left injector 131 has the smallest flow rate, the right injector 133 has the largest flow rate and the middle injector 132 has an intermediate flow rate between the smallest and largest flow rates.

As such, it is possible to properly set the ratio of the flow rates in the injectors 131 to 133 provided in the plurality of regions in the processing container 1.

Furthermore, FIG. 1 show a configuration in which there is no overlapping region among the plurality of injectors 131 to 133 and in which the mixed gas is supplied to completely different regions. However, for example, the plurality of injectors 131 to 133 may be arranged such that the adjacent regions partially overlap with each other.

The processing container 1 is a container configured to receive the wafer W and performing predetermined substrate processing. In addition, the rotary table 2 is a substrate holding unit configured to hold the wafer. In FIG. 1, the rotary table 2 with the wafer W mounted and held on an upper surface thereof is shown by way of example. However, so far as the rotary table can hold the wafer W such that the wafer can be processed, the rotary table may have various configurations and is not necessarily rotatable and may be, for example, a simple mounting table.

As shown in FIG. 1, the mixed gas multiple line supply system according to the first embodiment is a supply system in which three kinds of process gases are mixed and the mixed gas are split and supplied into three lines. Here, pipes divided into three lines are only the individual pipes 181 to 183 and the branch pipes 221 to 223. The number of the flow rate controllers 171 to 173 is also only three.

If this supply system is realized in the configuration of the related art disclosed in the section "BACKGROUND", since there are three final supply lines, nine (3×3=9) flow rate controllers 171 to 173 and nine (3×3=9) individual pipes 181 to 183 are required for the three gas supply sources 161 to 163. In addition, three mixing pipes 190 are required, whereby the number of necessary pipes becomes enormous and the apparatus is also enlarged.

As compared with the configuration described above, the mixed gas multiple line supply system according to the first embodiment can reduce the numbers of the respective components arranged from the gas supply sources 161 to 163 to the flow splitter 210 down to ⅓ thereof, thereby enabling considerable space saving and cost reduction.

As such, in the mixed gas multiple line supply system 250 and the substrate processing apparatus 300 according to the first embodiment, the flow splitter 210 is effectively utilized, thereby achieving great simplification of the gas unit and the entire apparatus.

<Second Embodiment>

Figure 2:
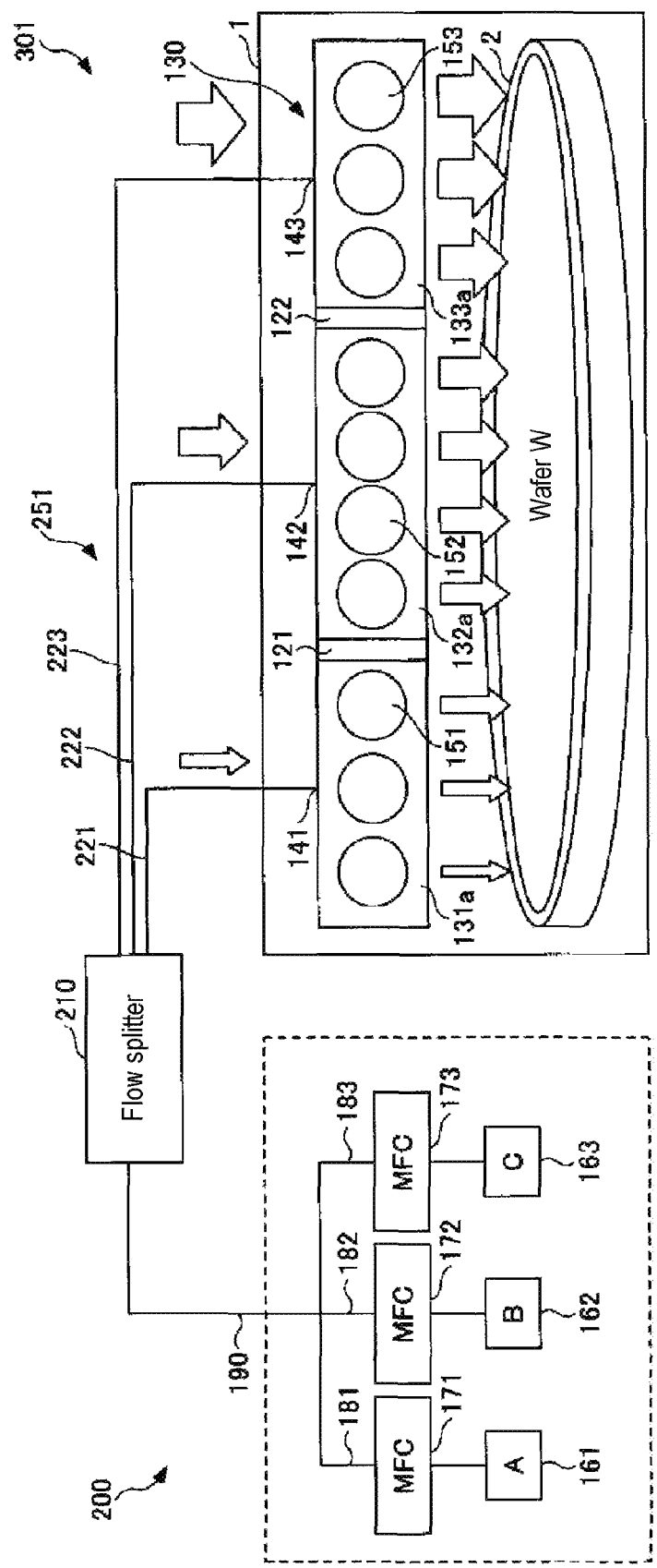
FIG. 2 is a view illustrating examples of a mixed gas multiple line supply system and a substrate processing apparatus according to a second embodiment of the present disclosure.

FIG. 2 is a view showing an example of a mixed gas multiple line supply system and a substrate processing apparatus according to a second embodiment of the present disclosure. Since a configuration of the mixed gas generating part 200 in the second embodiment is the same as that in the first embodiment, the components of the mixed gas generating part are designated by like reference numerals and descriptions thereof will be omitted.

The mixed gas multiple line supply system 251 and the substrate processing apparatus 301 according to the second embodiment are different from the mixed gas multiple line supply system 250 and the substrate processing apparatus 300 according to the first embodiment in that the number of an injector 130 is one as a whole and an interior of the injector is divided into a plurality of chambers 131a to 133a by partitions 121 and 122.

There is no great difference in substantial functions between the mixed gas multiple line supply system 251 and the substrate processing apparatus 301 according to the second embodiment and the mixed gas multiple line supply system 250 and the substrate processing apparatus 300 according to the first embodiment in which the injectors 131 to 133 are individually installed. However, since only one injector 130 is used in this configuration, it is possible to reduce the number of parts, thereby enabling further miniaturization of the apparatus.

Since other functions and effects of the mixed gas multiple line supply system 251 and the substrate processing apparatus 301 according to the second embodiment are the same as those of the mixed gas multi-system supply system 250 and the substrate processing apparatus 300 according to the first embodiment, descriptions thereof will be omitted.

<Third Embodiment>

FIG. 3 is a view showing an example of a mixed gas multiple line supply system 252 and a substrate processing apparatus 302 according to a third embodiment of the present disclosure. A configuration of a mixed gas generating part 200 in the third embodiment is the same as those in the first and second embodiments, the components of the mixed gas generating part are designated by like reference numerals and descriptions thereof will be omitted.

The mixed gas multiple line supply system 252 and the substrate processing apparatus 302 according to the third embodiment are the same as the mixed gas multiple line supply system 251 and the substrate processing apparatus 301 according to the second embodiment in that the number of an injector 130a is one as a whole and an interior of the injector is divided into a plurality of chambers 131a to 133a by partitions 121a and 122a. However, the mixed gas multiple line supply system 252 and the substrate processing apparatus 302 according to the third embodiment is different from the mixed gas multiple line supply system 251 and the substrate processing apparatus 301 according to the second embodiment in that orifices 111 and 112 are provided in the partitions 121a and 122a.

Here, the orifices 111 and 112 are openings functioning as communicating holes through which a plurality of chambers 131a to 133a in the injector 130 can communicate with one another. If the mixed gas is supplied to the respective chambers 131a to 133a at different flow rates, pressures in the chambers are different from one another in proportion to the flow rates. By using the differences in pressure, it is possible to generate a variety of changes in flow-splitting ratios over the number of the multiple lines. In other words, the interior of the injector 130a is not completely partitioned by the partitions 121a and 122a, but by forming the orifices 111 and 112 in the partitions 121a and 122, some of the mixed gas flows from one of the chambers 131a to 133a having a larger flow rate to another of the chambers 131a to 133a having a smaller flow rate (from one of the chambers 131a to 133a having a higher pressure to another of the chambers 131a to 133a having a lower pressure). Since gas discharge amounts from the respective gas discharge holes 151 to 153 are proportional to the internal pressures, the gas discharge amounts from one or more of the gas discharge holes 151 to 153 near the orifices 111 and 112 are more affected by the pressures from the adjacent chambers 131a to 133a with the orifices 111 and 112 interposed therebetween, as compared with the gas discharge amounts from one or more of the gas discharge holes 151 to 153 far from the orifices 111 and 112. Thus, the flow split of the mixed gas is made smoother for the number of flow split by the flow splitter.

In the example in FIG. 3, since the flow rates and the pressures are higher in the order of the chamber 133a, the chamber 132a and the chamber 131a, some of the mixed gas in the chamber 133a flow into the chamber 132a via the orifice 112, and some of the mixed gas in the chamber 132a flow into the chamber 131a via the orifice 111. As schematically shown by arrows in FIG. 3, the flow rates of three split lines are distributed in a pattern in which the flow rates are gradually decreased from a right side toward a left so that the mixed gas can be discharged at ten (10) stepwise flow rates.

As such, with the mixed gas multiple line supply system 252 and the substrate processing apparatus 302 according to the third embodiment, it is possible to discharge the mixed gas by smoothly splitting the mixed gas flow while realizing miniaturization of the apparatus.

Figure 4A:
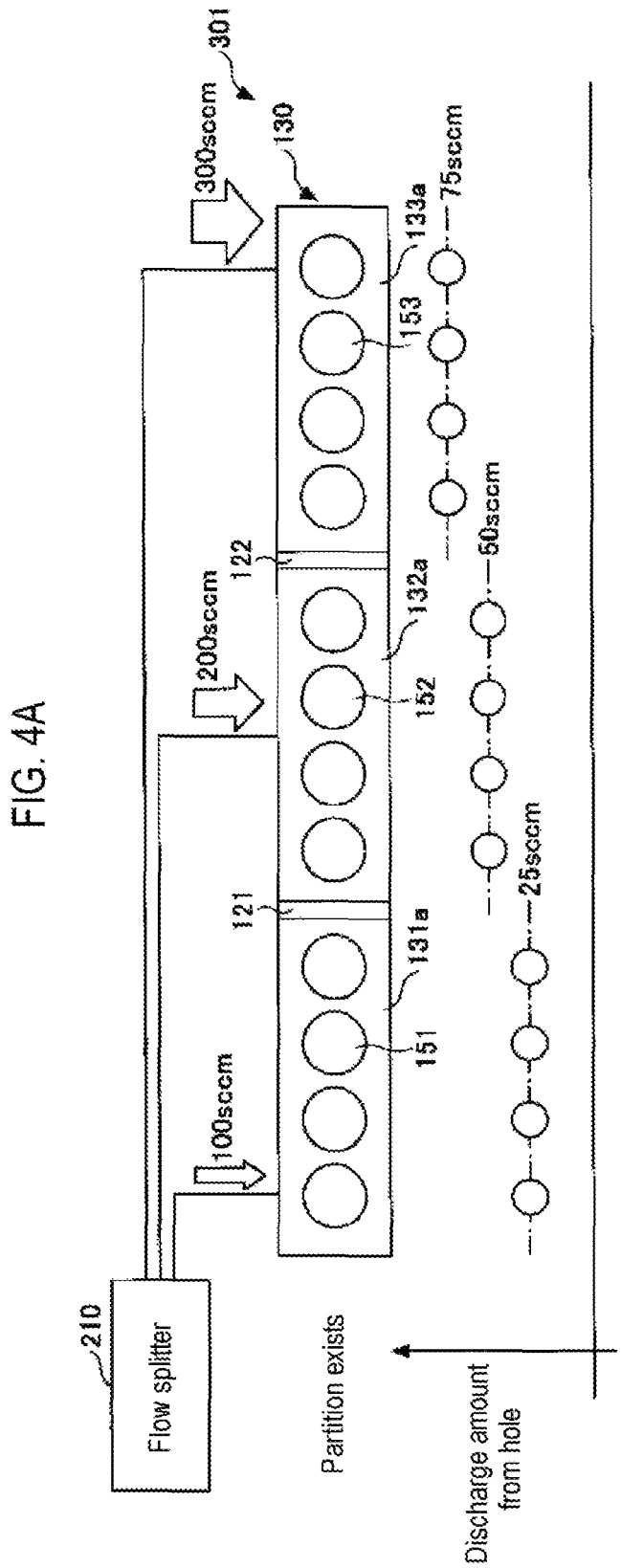

FIGS. 4A and 4B are views illustrating a difference between a discharge amount in the mixed gas multiple line supply system 251 and the substrate processing apparatus 301 according to the second embodiment and a discharge amount in the mixed gas multiple line supply system 252 and the substrate processing apparatus 302 according to the third embodiment of the present disclosure.

FIG. 4A is a view showing a discharge amount of a mixed gas discharged from an injector 130 of the mixed gas multiple line supply system 251 and the substrate processing apparatus 301 according to the second embodiment. As shown in FIG. 4A, it is assumed that in setting a flow rate ratio of the flow splitter 210, a flow rate of 100 sccm is set in the chamber 131a, a flow rate of 200 sccm is set in the chamber 132a and a flow rate of 300 sccm is set in the chamber 133a, resulting in a flow rate ratio of 1:2:3. Assuming that, in this case, a discharge amount from each of the gas discharge holes 151 to 153 is an output amount of 25 sccm with respect to a supply of 100 sccm, the discharge amount from the gas discharge hole 151 of the chamber 131a is 25 sccm, the discharge amount from the gas discharge hole 152 of the chamber 132a is 50 sccm and the discharge amount from the gas discharge hole 153 of the chamber 133a is 75 sccm, thereby also resulting in a stepwise output of 1:2:3.

FIG. 4B is a view showing a discharge amount of a mixed gas discharged from an injector 130a of the mixed gas multiple line supply system 252 and the substrate processing apparatus 302 according to the third embodiment. Similarly to FIG. 4A, it is assumed that, in setting the flow rate ratio of the flow splitter 210, a flow rate of 100 sccm is set in the chamber 131a, a flow rate of 200 sccm is set in the chamber 132a and a flow rate of 300 sccm is set in the chamber 133a, resulting in a flow rate ratio of 1:2:3. Further, like FIG. 4A, a discharge amount from each of the gas discharge holes 151 to 153 is basically an output amount of 25 sccm with respect to a supply of 100 sccm.

In this case, some of the mixed gas in the chamber 133a flow into the adjacent chamber 132a via the orifice 112, and some of the mixed gas in the chamber 132a flow into the adjacent chamber 131a via the orifice 111. As a result, the mixed gas is discharged from the gas discharge hole 153 of the chamber 133a far from the rightmost orifice 112 at about 75 sccm as calculated. The discharge amount is more influenced by the orifice 112 as going to the left side, so that the flow of the mixed gas is divided into the gas discharge hole 153 and the orifice 112, whereby the discharge amount decreases as going to the left side.

Meanwhile, in the central chamber 132a, the right gas discharge hole 152 is affected by the mixed gas flowing from the chamber 133a via the orifice 112, so that the discharge amount becomes greater than 50 sccm. Although the discharge amount from the second gas discharge hole from the right side is about 50 sccm as calculated, the flow rate is more affected by the orifice 111 as getting closer to the left side, so that the discharge amount is gradually decreased. A similar phenomenon also occurs in the left chamber 131a, so that the flow rate of the leftmost gas discharge hole 151 farthest from the orifice 111 is 25 sccm as calculated. The flow rate is more affected by the mixed gas flowing from the adjacent chamber 132a via the orifice 111 as getting closer to the right side, whereby the discharge amount is gradually increased.

As a result, the mixed gas is discharged from the gas discharge holes 151 to 153 with a smooth distribution of the discharge amount as a whole.

As such, if the partitions 121 and 122 are formed of fully partitioning plates, the discharge amounts of the mixed gas from the respective chambers 131a to 133a become constant and have a stepwise distribution. If the partitions 121a and 122a having the orifices 111 and 112 are utilized, however, it is possible to discharge the mixed gas with a smooth distribution. By utilizing these properties, it is possible to realize a desired gas supply even though the flow splitter capable of setting only the ratio of the flow rates is used without installation of individual flow rate controllers.

<Fourth embodiment>

In the following embodiment, an example in which the mixed gas multiple line supply system 250 and the substrate processing apparatuses 300 to 302 described in the first to third embodiments are applied as a more specific substrate processing apparatus will be described. A substrate processing apparatus 303 according to the fourth embodiment is configured as an ALD (atomic layer deposition) film-forming apparatus and is an apparatus configured to perform film formation using the ALD method.

Figure 5:
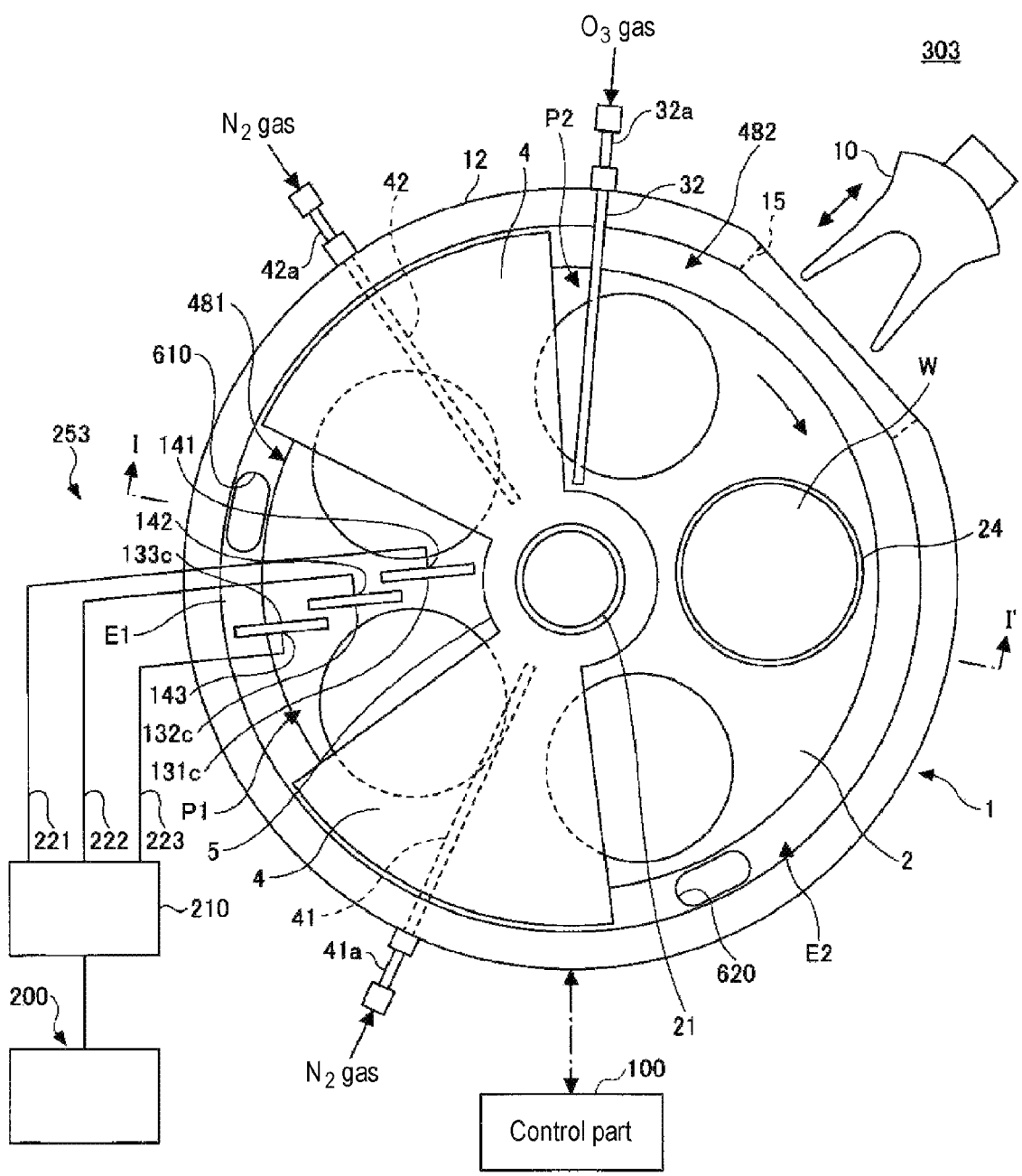
FIG. 5 is a view illustrating examples of a mixed gas multiple line supply system and a substrate processing apparatus according to a fourth embodiment of the present disclosure.

FIG. 5 is a view illustrating examples of a mixed gas multiple line supply system 253 and a substrate processing apparatus 303 according to a fourth embodiment of the present disclosure. In FIG. 5, an inner configuration of the processing container 1 of the substrate processing apparatus 303 is shown. In addition, since the processing container 1 and the rotary table 2 have the same shapes as those of the substrate processing apparatuses 300 to 302 according to the first to third embodiments, like reference numerals are used.

FIG. 5 shows a container main body 12, which defines a side surface and a bottom face of the processing container 1, with a ceiling plate removed from the processing container 1. The disk-shaped rotary table 2 is provided above a floor surface of the main body 12.

As shown in FIG. 5, circular recesses 24 configured to place a plurality of wafers W (five (5) wafers in the illustrated example) therein are formed in a surface of the rotary table 2 in a rotational direction (a circumferential direction). FIG. 5 shows that the wafer W is mounted in only one recess 24 for the sake of convenience. The inner diameter of the recess 24 is slightly greater, e.g., by 4 mm, than a diameter (for example, 300 mm) of the wafer W. The depth of the recess 24 is substantially equal to a thickness of the wafer W. Thus, when the wafer W is placed in the recess 24, the surface of the wafer W is flush with the surface (a region on which the wafer W is not mounted) of the rotary table 2.

Injectors 131c to 133c, a reaction gas nozzle 32 and separation gas nozzles 41 and 42, which are made of, example, quartz, are arranged above the rotary table 2. In the illustrated example, the separation gas nozzle 42, the injectors 131 to 133, the separation gas nozzle 42 and the reaction gas nozzles 32 are arranged in this order in a clockwise direction (the rotation direction of the rotary table 2) from a transfer port 15 (described later) at certain intervals in a circumferential direction of the processing container 1. The injectors 131c to 133c are similar to the injectors 131 to 133 separately and independently provided for each of the plurality of regions as described in the first embodiment. In FIG. 5, in a radial direction of the rotary table 2, the injector 131c is provided at a region on a central side of the rotary table 2, the injector 133c is provided at a region on an outer peripheral side of the rotary table 2 and the injector 132c is provided at a region on an intermediate side of the rotary table 2. With rotation of the rotary table 2, the wafer W mounted on the rotary table 2 is moved in the rotation direction. By discharging the mixed gas from the gas discharge holes 151 to 153 of the injectors 131c to 133c, the mixed gas is sequentially supplied to a plurality of wafers W (five (5) wafers in FIGS. 4A and 4B). Therefore, the entire diameter of the wafer W is covered with three injectors 131c to 133c, so that the mixed gas is supplied to the entire surface of the wafer W. Although the injectors 131c to 133c basically cover the different regions on the outer peripheral, intermediate and central sides in the radial direction of the rotary table 2 without overlapping with one another, end portions of the adjacent injectors 131c and 132c overlap with each other and end portions of the adjacent injectors 132c and 133c overlap with each other.

The supply of the mixed gas to the respective injectors 131c to 133c is performed by splitting the mixed gas, which is generated in the mixed gas generating part 200, in the flow splitter 210 and by supplying the split mixed gases to the gas introducing ports 141 to 143 via the branch pipes 221 to 223, respectively. As shown in FIGS. 1 and 3, the branch pipes 221 to 223 are introduced through an upper face of the processing container 1, and the mixed gas is introduced into the respective gas introducing ports 141 to 143 of the respective injectors 131c to 133c.

When the rotary table 2 is rotated, a movement distance on the outer peripheral side of the rotary table is larger than that on the central side thereof, so that a moving speed at the outer periphery is higher than that at the central portion. Therefore, since on the outer peripheral side of the rotary table 2, a time for adsorption of the mixed gas on the wafer W may not be sufficient, there is a case where a flow rate on the outer peripheral side is set to be larger than a flow rate on an inner peripheral side. Therefore, the present embodiment also employs an example where the flow rates are set to be larger in the order of the injector 133c, the injector 132c and the injector 131c, like the foregoing case.

The gas introducing ports 32a, 41a and 42a, which are proximal ends of the nozzles 32, 41, and 42, respectively, are fixed on an outer peripheral wall of the container main body 12, such that the nozzles 32, 41, and 42 are introduced from the outer peripheral wall of the processing container 1 into the processing container 1 and extend in parallel to the rotary table 2 in a radial direction of the container main body 12.

A gas supply source and, if necessary, a flow rate controller may be connected to each of the nozzles 32, 41 and 42, and various gases may be supplied to the nozzles depending on the processes.

For example, in order to oxidize a silicon-based gas to generate $SiO_2$, a supply source (not shown) for supplying ozone ($O_3$) gas may be connected to the reaction gas nozzle 32 via an opening/closing valve and a flow rate controller (both are not shown).

In addition, a supply source of a rare gas such as argon (Ar) gas and helium (He) gas or an inert gas such as nitrogen gas may be connected to the separation gas nozzles 41 and 42 via an opening/closing valve and a flow rate controller (both are not shown). FIG. 5 shows an example in which $N_2$ gas is used as the inert gas.

Figure 6:
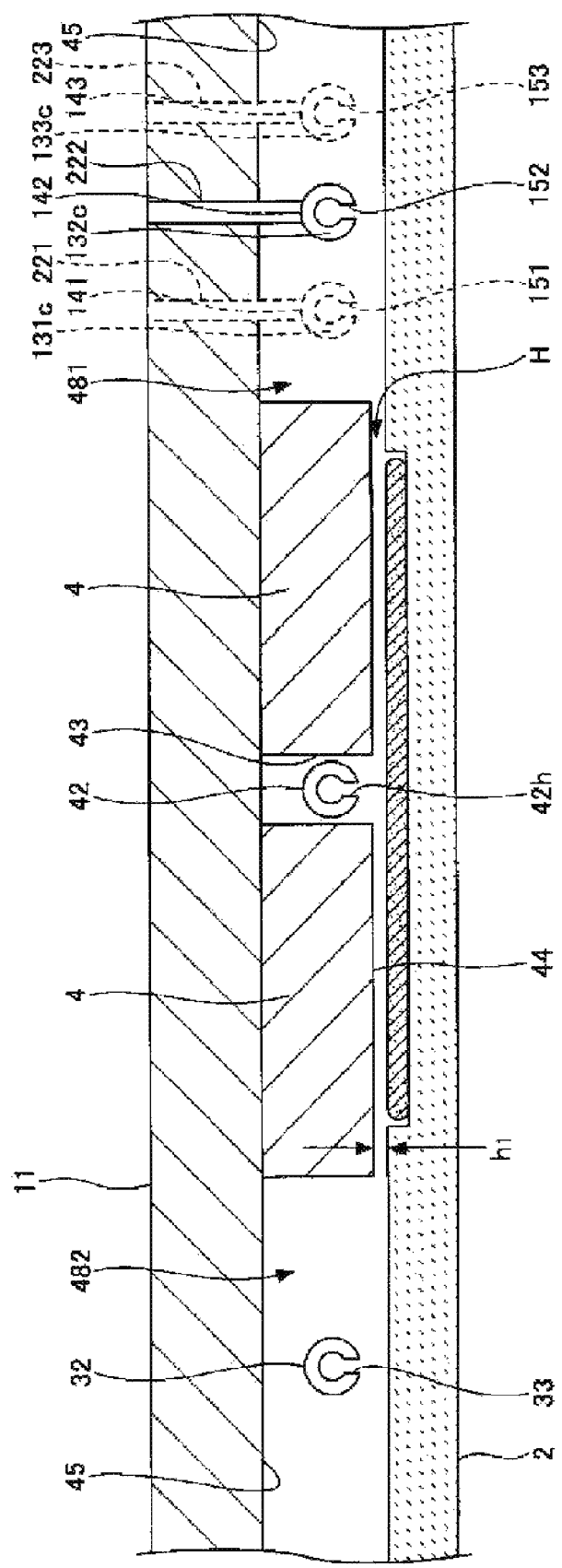
FIG. 6 shows a sectional view of a processing container, when taken along a concentric circle of a rotary table 2, from injectors to a reaction gas nozzle of the substrate processing apparatus according to the fourth embodiment of the present disclosure.

FIG. 6 shows a sectional view of the processing container 1 along a concentric circle of the rotary table 2 from the injectors 131c to 133c to the reaction gas nozzle 32. As shown in FIG. 6, the branch pipes 221 to 223 are connected to the injectors 131c to 133c through the ceiling plate 11 of the processing container 1, and the mixed gas is supplied to the gas introducing ports 141 to 143. The gas discharge holes 151 to 153 are formed in lower surfaces of the respective injectors 131c to 133c.

Further, a plurality of gas discharge holes 33 opened downwardly toward the rotary table 2 are formed in the reaction gas nozzle 32 and are arranged in a longitudinal direction of the reaction gas nozzle 32. A region below the injectors 131c to 133c becomes a first processing region P1 in which the mixed gas such as a silicon-based gas or the like is adsorbed onto the wafer W. A region below the reaction gas nozzle 32 becomes a second processing region P2 in which the mixed gas adsorbed on the wafer W in the first processing region P1 is oxidized.

Referring to FIGS. 5 and 6, two protruding portions 4 are provided in the processing container 1. Each of the protruding portions 4 has a substantially fan-like planar shape whose apex is cut in an arc-shape. In the present embodiment, an inner arc portion of the protruding portion is connected to a protrusion 5 (described later) and the outer arc portion is disposed to conform to an inner peripheral surface of the container main body 12 of the processing container 1. As shown in the figures, the protruding portions 4 are provided on a rear surface of the ceiling plate 11. For this reason, flat low ceiling surfaces 44 (first ceiling surfaces), which are lower surfaces of the protruding portions 4, and ceiling surfaces 45 (second ceiling surface), which are higher than the ceiling surfaces 44 and in which are placed on both circumferential sides of the ceiling surfaces 44, exist within the processing container 1.

In addition, as shown in FIG. 6, a groove portion 43 is formed at a circumferential center of one of the protruding portions 4 and extends in the radial direction of the rotary table 2. The separation gas nozzle 42 is accommodated in the groove portion 43. Similarly, a groove portion 43 is formed in the other protruding portion 4 and the separation gas nozzle 41 is accommodated in the groove portion 43. Further, a gas discharge hole 42h is formed in the separation gas nozzle 42.

The injectors 131c to 133c and the reaction gas nozzle 32 are provided in spaces below the higher ceiling surface 45, respectively. The injectors 131c to 133c and the reaction gas nozzles 31 and 32 are provided in the vicinity of the wafer W while being spaced apart from the ceiling surface 45.

The low ceiling surfaces 44 define a separation space H, which is a narrow space, with respect to the rotary table 2. When $N_2$ gas is supplied from the separation gas nozzle 42, $N_2$ gas flows toward spaces 481 and 482 through the separation space H. At this time, since the volume of the separation space H is smaller than those of the spaces 481 and 482, the pressure in the separation space H can be made higher than that in the spaces 481 and 482 by nitrogen ($N_2$) gas. In other words, the separation space H provides a pressure barrier between the spaces 481 and 482. Therefore, the mixed gas such as 3DMAS from the first region P1 and $O_3$ gas from the second region P2 are separated by the separation space H. As a result, the mixed gas and $O_3$ gas are inhibited from being mixed and reacted with each other within the processing container 1.

Figure 7:
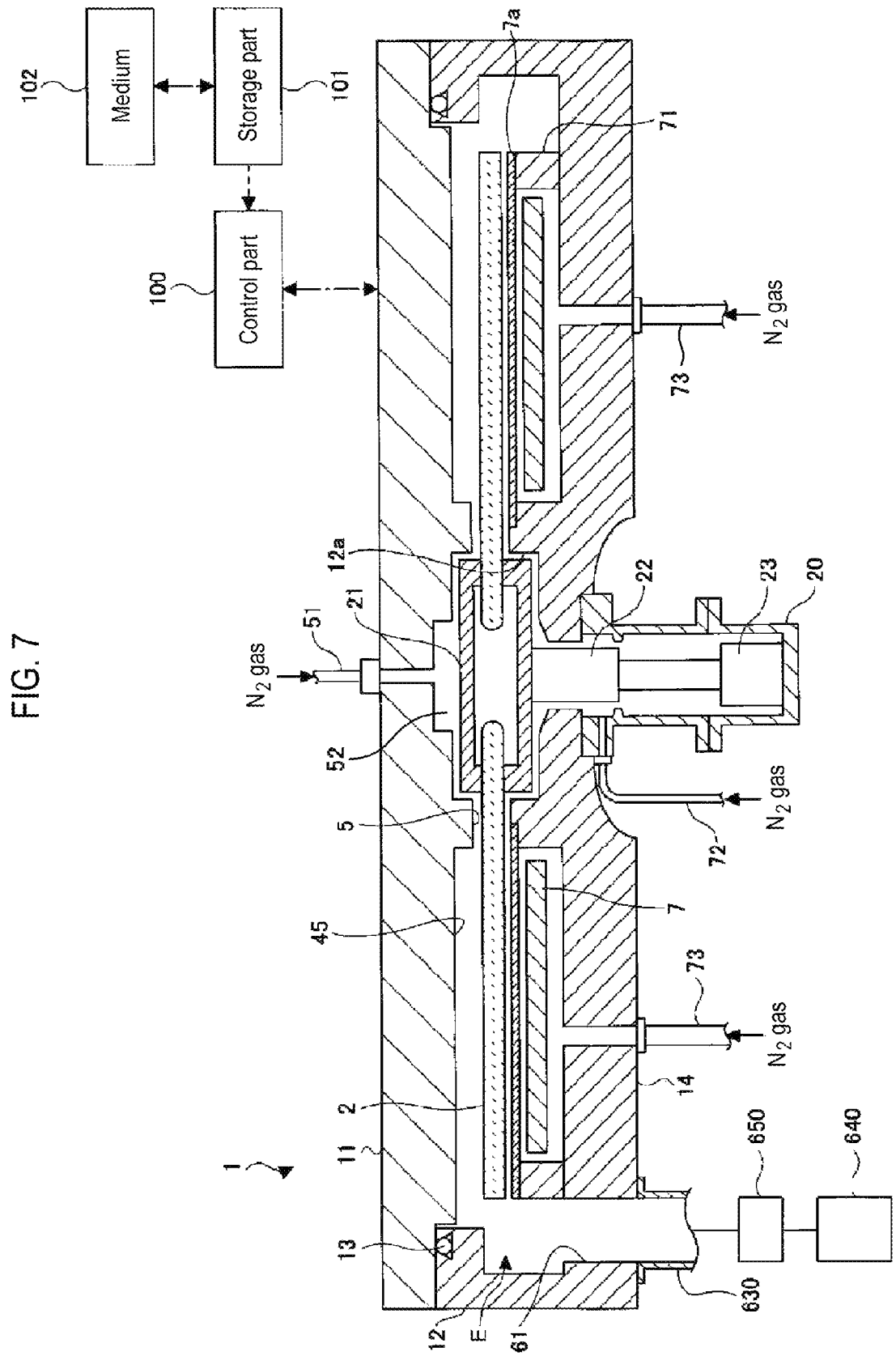
FIG. 7 is a sectional view taken along line I-I' in FIG. 5 showing a region in which a ceiling surface is provided.

FIG. 7 is a sectional view taken along line I-I' in FIG. 5 showing a region in which a ceiling surface 45 is provided.

As shown in FIG. 7, the substrate processing apparatus has the flat processing container 1 having a substantially circular planar shape and the rotary table 2 provided in the processing container 1 and having a rotation center at a center of the processing container 1. The processing container 1 has the container main body 12 in the shape of a cylinder with a bottom surface, and the ceiling plate 11 detachably and hermetically disposed on an upper face of the container main body 12 with a seal member 13 such as an O-ring or the like interposed therebetween.

The rotary table 2 is fixed to a cylindrical core part 21 at the central portion of the rotary table, and the core part 21 is fixed to an upper end of a rotational shaft 22 extending in a vertical direction. The rotational shaft 22 passes through a bottom portion 14 of the processing container 1 and a lower end of the rotational shaft is attached to a driving part 23 configured to rotate the rotational shaft 22 around a vertical axis. The rotational shaft 22 and the driving part 23 are accommodated in a tube-shaped case body 20 with an opened top face. A flange portion provided at the upper face of the case body 20 is hermetically installed on a lower surface of the bottom portion 14 of the processing container 1, so that an internal atmosphere of the case body 20 is isolated from an external atmosphere.

A first evacuation port 610 communicating with the space 481 and a second evacuation port 620 communicating with the space 482 are formed between the rotary table 2 and the inner peripheral surface of the container main body. As shown in FIG. 7, the first evacuation port 610 and the second evacuation port 620 are connected to a vacuum pump 640, which is a vacuum evacuation unit, via an evacuation pipe 630, respectively. In addition, a pressure regulator 650 is provided in the evacuation pipe 630.

As shown in FIG. 7, a heater unit 7 functioning as a heating device is provided in a space between the rotary table 2 and the bottom portion 14 of the processing container 1, and the wafer W on the rotary table 2 is heated through the rotary table 2 to a temperature (for example, 450 degrees C.) determined by a process recipe. A ring-shaped cover member 71 is provided below and near the outer periphery of the rotary table 2 in order to prevent a gas from entering the space below the rotary table 2.

As shown in FIG. 7, a region of the bottom portion 14 of the processing container, which is closer to the rotation center rather than the space with the heater unit 7 disposed therein, protrudes upwardly to approach the core part 21 near a central portion of the lower surface of the rotary table 2, thereby defining a protrusion 12a. A narrow space is formed between the protrusion 12a and the core part 21. In addition, a narrow gap is formed between the rotational shaft 22 and an inner peripheral surface of a through hole which is formed through the bottom portion 14 and through which the rotational shaft 22 passes, and these narrow spaces communicate with the case body 20. Moreover, a purge gas supplying pipe 72 is installed on the case body 20 in order to supply $N_2$ gas as a purge gas into the narrow spaces to purge the spaces. Further, a plurality of purge gas supplying pipes 73 configured to purge the space with the heater unit 7 placed therein are provided below the heater unit 7 and at the bottom portion 14 of the processing container 1 at predetermined angular intervals in the circumferential direction (two purge gas supplying pipes 73 are shown in FIG. 7).

Further, a separation gas supplying pipe 51 is connected to a central portion of the ceiling plate 11 of the processing container 1 so as to supply $N_2$ gas as a separation gas into a space 52 between the ceiling plate 11 and a core part 21.

Further, as shown in FIG. 5, a sidewall of the processing container 1 is provided with the transfer port 15 used for transferring a wafer W, which is a substrate, between an external transfer arm 10 and the rotary table 2.

Moreover, as shown in FIG. 7, the substrate processing apparatus according to the present embodiment is provided with a control part 100 configured by a computer configured to control operations of the entire apparatus. A program for allowing a film-forming method described later to be performed in a film forming apparatus under the control of the control part 100 is stored in a memory of the control part 100. This program is stored in a medium 102 such as a hard disk, a compact disk, a magneto-optical disk, a memory card, a flexible disk or the like, and is read into a storage part 101 by a certain reading device and then installed into the control part 100.

As such, the mixed gas multiple line supply system 250 can be suitably used for the substrate processing apparatus 303 that performs the film formation, whereby it is possible to accurately control the flow rates of the mixed gas for the respective regions in the processing container 1 in which the injectors 131c to 133c are provided and to perform the film formation with good in-plane uniformity.

<Fifth Embodiment>

Figure 8:
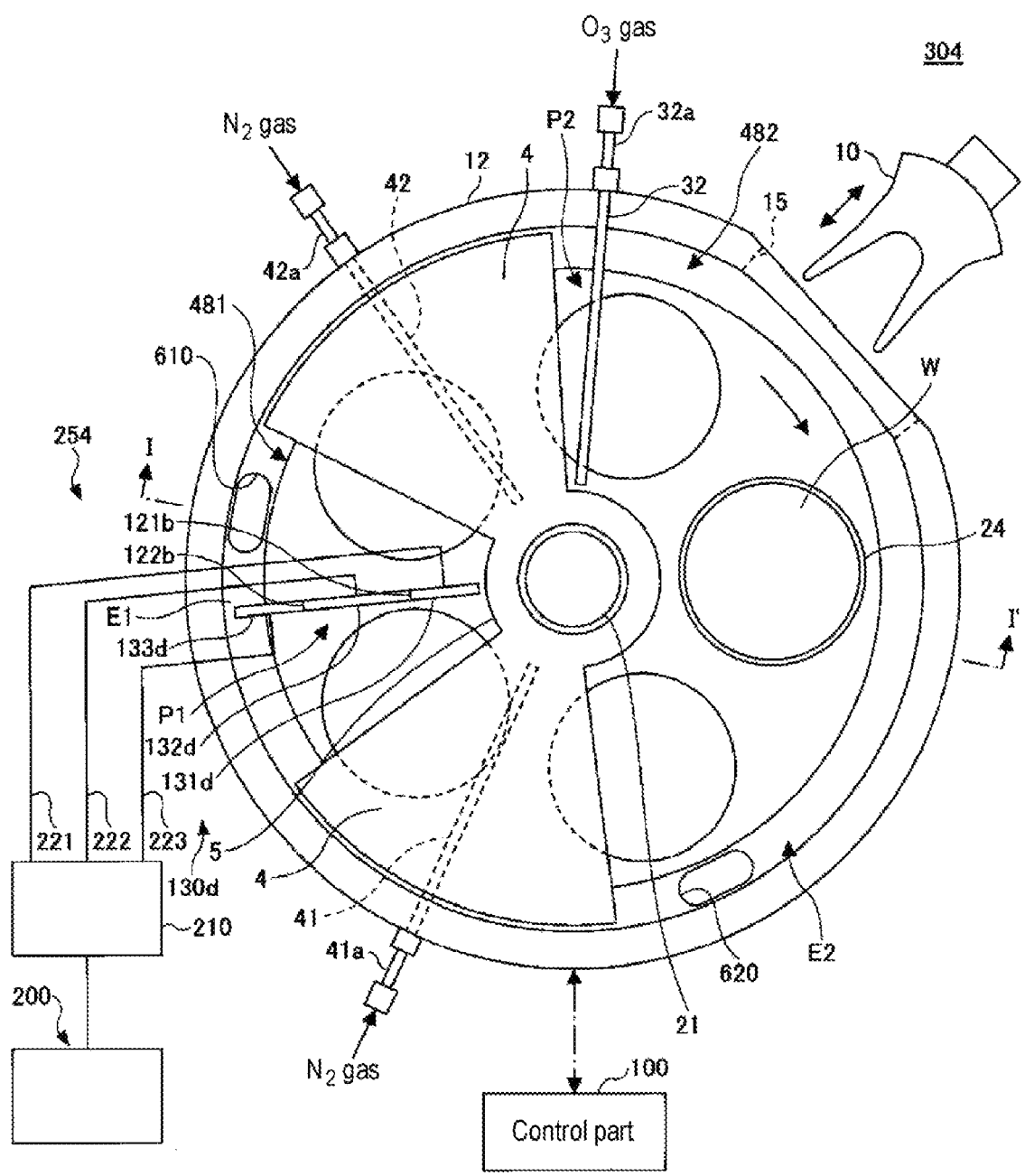
FIG. 8 is a view illustrating examples of a mixed gas multiple line supply system and a substrate processing apparatus according to a fifth embodiment of the present disclosure.

FIG. 8 is a view illustrating examples of a mixed gas multiple line supply system 254 and a substrate processing apparatus 304 according to a fifth embodiment of the present disclosure. In FIG. 8, one injector 130d is connected to the flow splitter 210, and the injector 130d has chambers 131 to 133 as three (3) regions.

Figure 9:
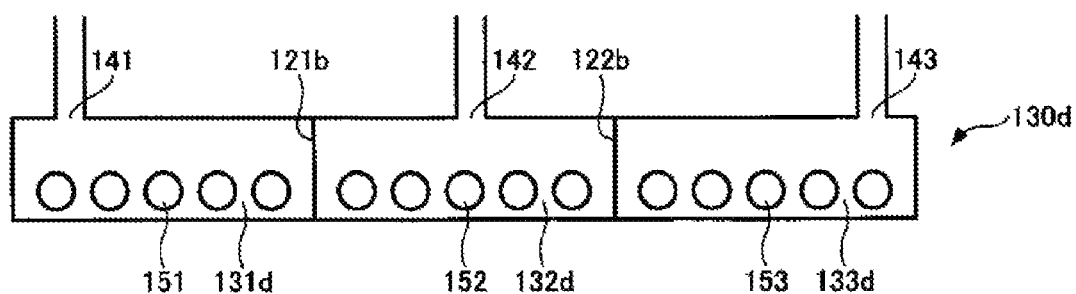
FIG. 9 is a sectional view illustrating an example of an injector of the mixed gas multiple line supply system and the substrate processing apparatus according to the fifth embodiment of the present disclosure.

FIG. 9 is a sectional view illustrating an example of the injector 130d of the mixed gas multiple line supply system 254 and the substrate processing apparatus 304 according to the fifth embodiment of the present disclosure. The substrate processing apparatus according to the fifth embodiment has the same planar configuration as the substrate processing apparatus 303 according to the fourth embodiment shown in FIG. 5, although only a configuration of the injector 130d is different from that of the injector in the fourth embodiment.

In the injector 130d of the substrate processing apparatus according to the fifth embodiment, as shown in FIG. 9, complete plate-shaped partitions 121b and 122b are provided within the injector 130d to completely separate the chambers 131d to 133d from one another. This configuration is similar to that of the mixed gas multiple line supply system 251 and the substrate processing apparatus 301 according to the second embodiment.

As such, it is possible to employ the configuration in which the complete plate-shaped partitions 121b and 122b are provided within the injector 130d to completely separate the chambers 131d to 133d from one another. With such a configuration, it is possible to configure the injector 130d in a space-saving manner and at low costs as compared with independent installation of three separate injectors 131c to 133c.

Since other components are the same as those of the substrate processing apparatuses 302 and 303 according to the second and fourth embodiments, descriptions thereof will be omitted.

<Sixth Embodiment>

Figure 10:
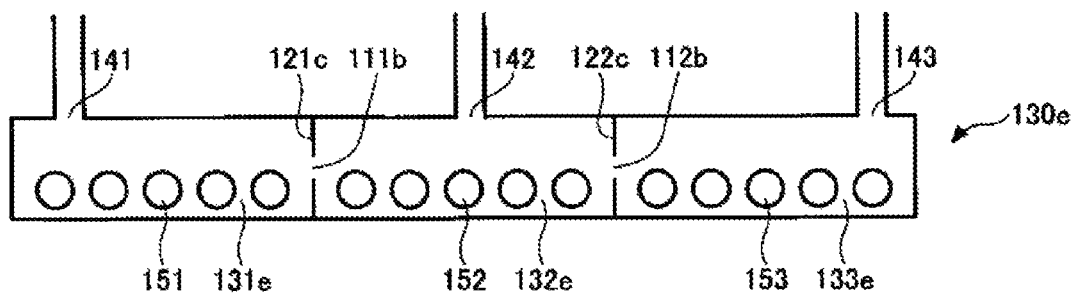
FIG. 10 is a view illustrating an example of an injector of a mixed gas multiple line supply system and a substrate processing apparatus according to a sixth embodiment of the present disclosure.

FIG. 10 is a view illustrating an example of an injector 130e of a mixed gas multiple line supply system and a substrate processing apparatus according to a sixth embodiment of the present disclosure. In FIG. 10, one injector 130e is connected to the flow splitter 210, and an interior of the injector 130e is divided into three (3) chambers 131e, 132e and 133e by partitions 121c and 122c. Orifices 111b and 112b functioning as communicating holes are formed in the partitions 121c and 122c to allow the respective chambers 131e to 133e to communicate with one another. In other words, this configuration is an example in which the substrate processing apparatus 302 according to the third embodiment is applied to the specific ALD film forming apparatus. With the substrate processing apparatus according to the sixth embodiment as described above, it is possible to supply the mixed gas to respective regions in the processing container 1 with a smooth flow rate distribution, thereby performing ALD film forming processing.

Since other components are the same as those of the mixed gas multiple line supply systems 252 and 254 and the substrate processing apparatuses 302 and 304 according to the third to fifth embodiments, descriptions thereof will be omitted.

<Seventh Embodiment>

Figure 11:
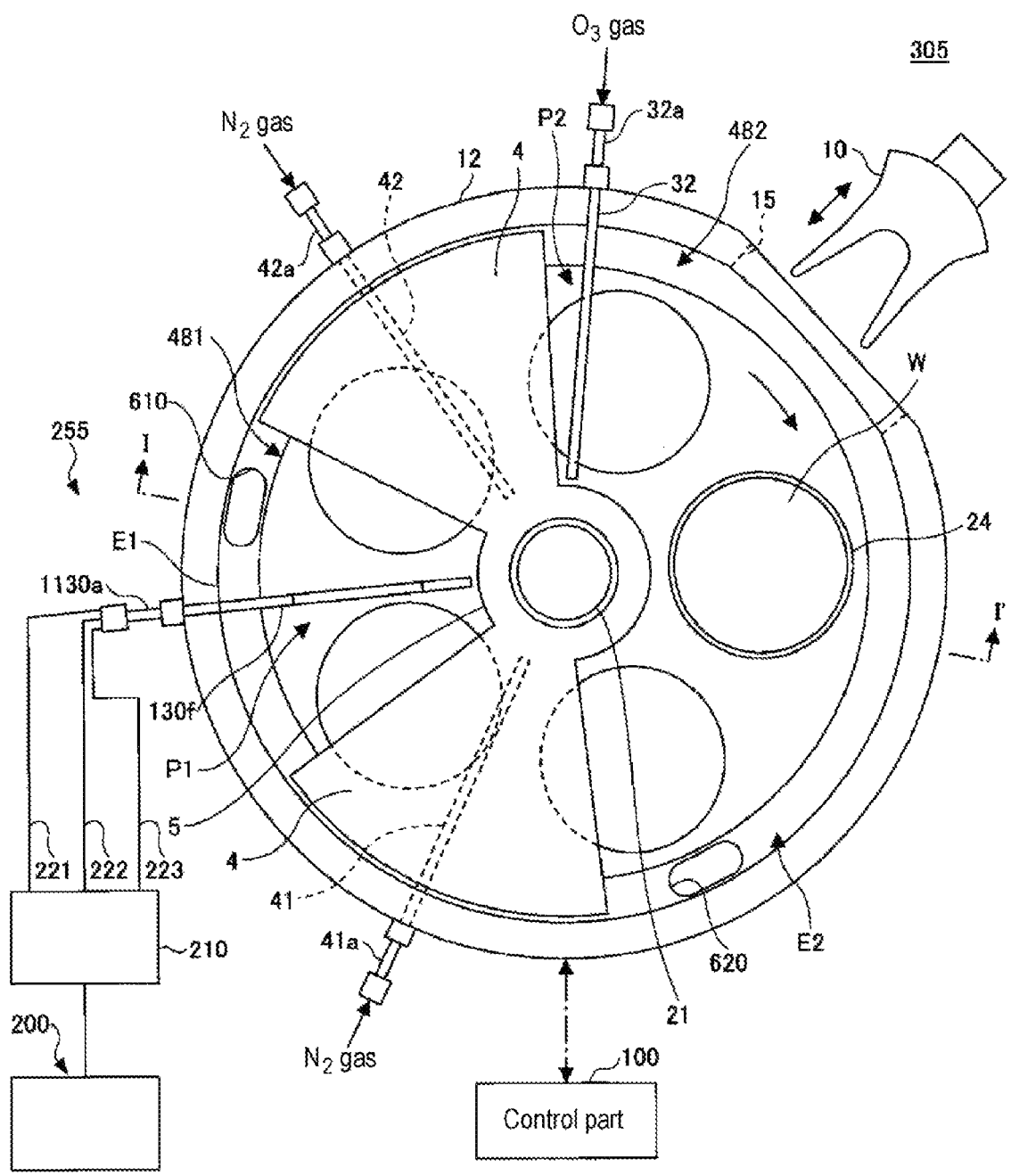
FIG. 11 is a view illustrating an example of a mixed gas multiple line supply system and a substrate processing apparatus according to a seventh embodiment of the present disclosure.

FIG. 11 is a view illustrating examples of a mixed gas multiple line supply system 255 and a substrate processing apparatus 305 according to a seventh embodiment of the present disclosure. The mixed gas multiple line supply system 255 and the substrate processing apparatus 305 according to the seventh embodiment and the substrate processing apparatuses 304 according to the fifth and sixth embodiments, are the same in that one injector 130f is employed, but are different from each other in that only one gas introducing port 1130a is provided at an outer periphery of the processing container 2.

In this case, the mixed gas is supplied from one gas introducing port 1130a, and the injector 130b is introduced into the processing container 1 through the outer peripheral wall of the container main body 12 and horizontally extends parallel to the rotary table 2 from an outer peripheral side toward a central side thereof.

Figure 12:
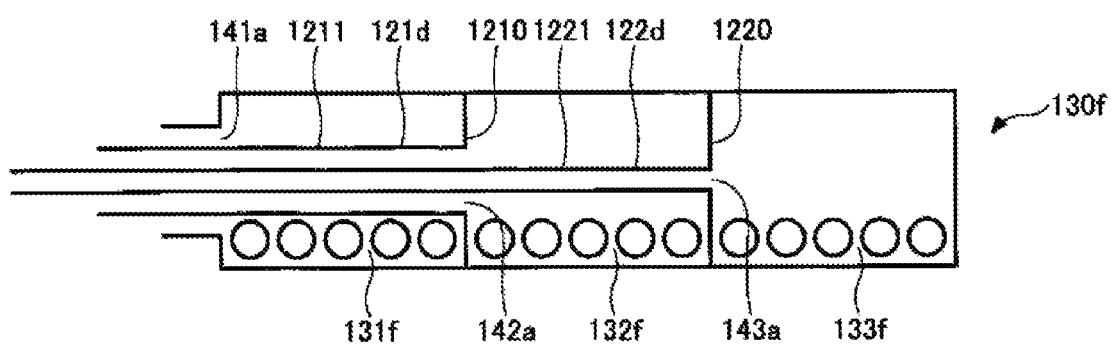
FIG. 12 is a view illustrating an example of an injector of the mixed gas multiple line supply system and the substrate processing apparatus according to the seventh embodiment of the present disclosure.

FIG. 12 is a view illustrating a sectional configuration of an example of the injector 130f. As shown in FIG. 12, partitions 121d and 122d of the injector 130f have portions 1210 and 1220 that are disposed perpendicular to a longitudinal direction of the injector 130b to divide the interior of the injector 130f into chambers 131f to 133f in the longitudinal direction, as well as portions 1211 and 1221 that extend in the longitudinal direction to allow the injector 130f to have a configuration of a concentric pipe such as a triple pipe and divide the respective chambers 131f to 133f in a radial direction of the injector 130f. Accordingly, gas introducing ports 141a to 143a of the respective chambers 131f to 133f are provided at positions moved in the longitudinal direction of the injector 130f, so that these gas introducing ports are provided at different positions in the longitudinal direction. Specifically, the gas introducing port 143a of the chamber 133f located on a right innermost side (tip side) is provided at a position moved to the right side, the gas introducing port 142a of the second chamber 132f is slightly on a left side (entrance side) from the center of the injector, and the gas introducing port 141a of the chamber 131f on the entrance side is on the most entrance side like the gas introducing port of the entire injector 130f.

As such, the injector 130f may be formed as a triple pipe by using the partitions 121d and 122d having the concentric tubular portions 1211 and 1221. In this case, similarly to other nozzles 32, 41 and 42, it possible to introduce the mixed gas from the outer peripheral wall of the container main body 12.

Since other components are the same as those of the mixed gas multiple line supply systems 253 to 255 and the substrate processing apparatuses 303 to 305 according to the fourth to sixth embodiments, descriptions thereof will be omitted.

<Eighth Embodiment>

Figure 13:
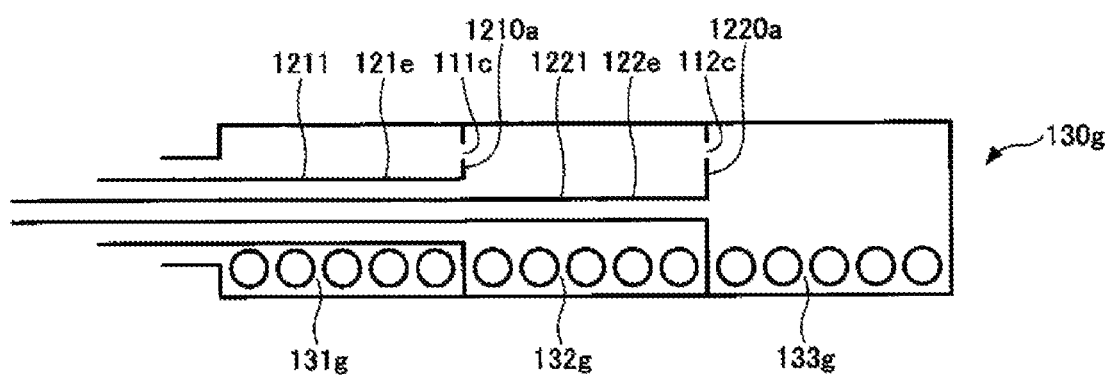
FIG. 13 is a view illustrating an example of an injector of a substrate processing apparatus according to an eighth embodiment of the present disclosure.

FIG. 13 is a view illustrating an example of an injector 130g of a substrate processing apparatus according to an eighth embodiment of the present disclosure. A mixed gas multiple line supply system and the substrate processing apparatus according to the eighth embodiment have the same planar configuration as the mixed gas multiple line supply system 255 and the substrate processing apparatus 305 according to the seventh embodiment shown in FIG. 11, although a configuration of the injector 130g is different from that of the injector in the seventh embodiment.

The injector 130g of the substrate processing apparatus according to the eighth embodiment is different from the injector 130b of the substrate processing apparatus 304 according to the sixth embodiment in that, as shown in FIG. 13, orifices 111c and 112c are formed in the partitions 121e and 122e to allow the chambers 131a to 133a to communicate with one another.

As such, the injector may be configured such that the chambers 131g to 133g communicate with one another by forming the orifices 111c and 112c in portions of the partitions 121e and 122e. With such a configuration, it is possible to configure the injector 130g in a space-saving manner and at low costs as compared with independent installation of three separate injectors 131c to 133c, and amounts of discharge from the gas discharge holes 151 to 153 can be smoothly distributed to perform control of flow rates with a higher accuracy. If the chambers 131g to 133g are configured to communicate with one another, the positions or sizes of the orifices 111c and 112c may be variously adjusted according to usages thereof.

Since other components are the same as those of the substrate processing apparatuses 303 to 305 according to the fourth to seventh embodiments, descriptions thereof will be omitted.

<Ninth Embodiment>

Figure 14:
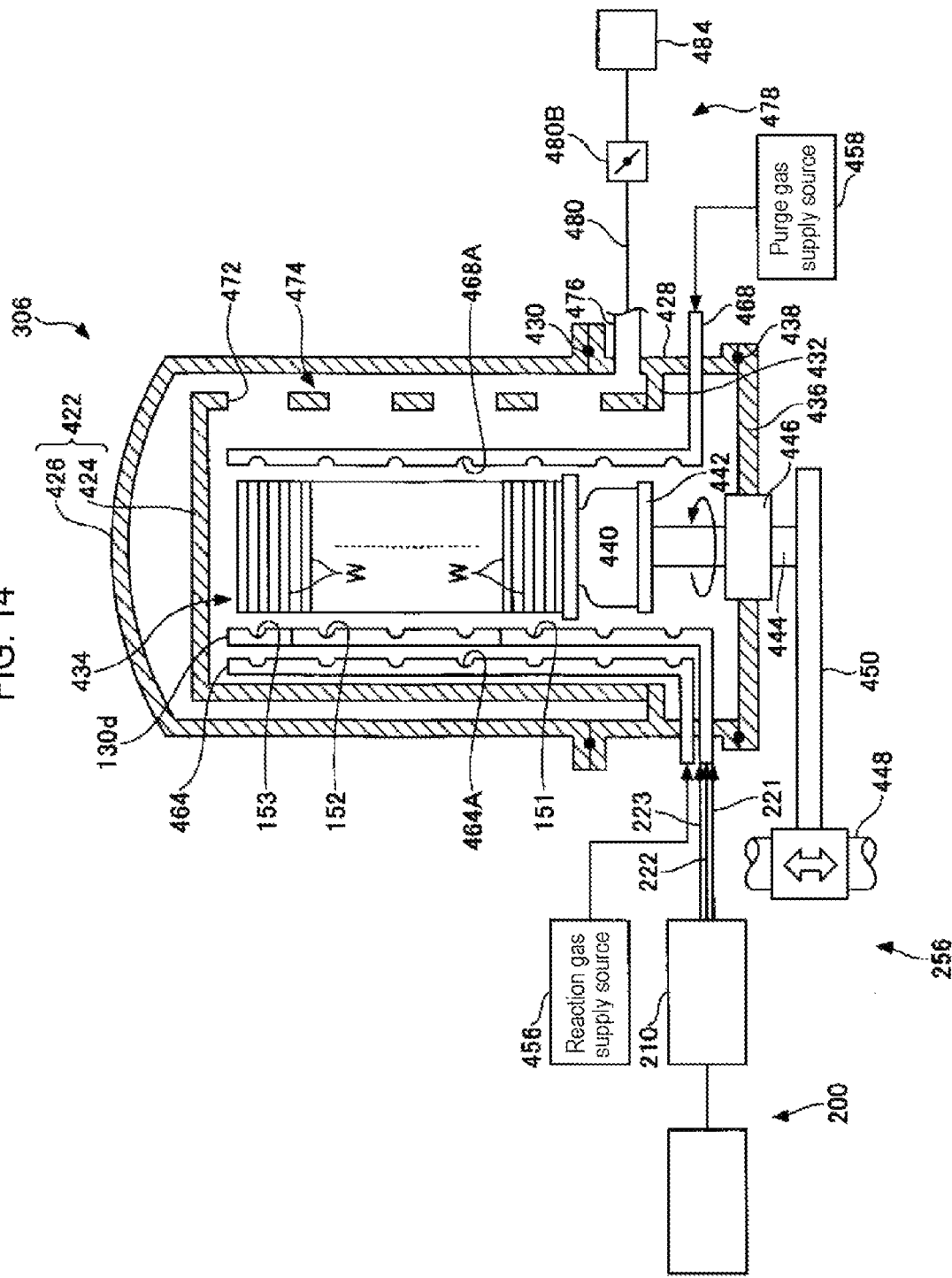
FIG. 14 is a view illustrating an example of a substrate processing apparatus according to a ninth embodiment of the present disclosure.

FIG. 14 is a view illustrating an example of a substrate processing apparatus according to a ninth embodiment of the present disclosure. A mixed gas multiple line supply system 256 and the substrate processing apparatus 306 according to the ninth embodiment will be described in connection with an example in which the mixed gas generating part 200 and the flow splitter 210 are applied to a vertical type heat treatment apparatus.

FIG. 14 shows an overall configuration illustrating an example of the substrate processing apparatus 306 according to the ninth embodiment of the present disclosure. As shown in the figure, the substrate processing apparatus 306 has a processing container 422 capable of accommodating a plurality of wafers W. The processing container 422 is composed of a vertically elongated cylindrical inner tube 424 with a ceiling and a vertically elongated cylindrical outer tube 426 with a ceiling. The outer tube 426 is disposed to surround the inner tube 424 with a predetermined gap between an outer periphery of the inner tube 424 and an inner periphery of the outer tube 426. In addition, all the inner and outer tubes 424 and 426 are made of, for example, quartz.

A cylindrical manifold 428 made of, for example, stainless steel is hermetically connected to a lower end of the outer tube 426 with a sealing member 430 such as an O-ring interposed therebetween, and the lower end of the outer tube 426 is supported by the manifold 428. The manifold 428 is supported by a base plate (not shown). Further, a ring-shaped support 432 is provided on an inner wall of the manifold 428, so that a lower end of the inner tube 424 is supported by the support 432.

A wafer boat 434 as a wafer holding part is accommodated in the inner tube 424 of the processing container 422. A plurality of wafers W are held at predetermined pitches on the wafer boat 434. In the present embodiment, for example, approximately 50 to 100 wafers W having a diameter of 300 mm are held in a stacked state by the wafer boat 434 at a substantially equal pitch. The wafer boat 434 can be raised or lowered, so that the wafer boat is accommodated into the inner tube 424 from below the processing container 422 through a lower opening of the manifold 428 or is taken out from the inner tube 424. The wafer boat 434 is made of, for example, quartz.

Further, when the wafer boat 434 is accommodated, the lower opening of the manifold 428, which is a lower end of the processing container 422, is hermetically closed by a cover part 436 made of, for example, quartz or stainless steel plate. A seal member 438 such as an O-ring is interposed between the lower end of the processing container 422 and the cover part 436 in order to maintain airtightness. The wafer boat 434 is placed on a table 442 with a heat-reserving tank 440 made of quartz interposed therebetween, and the table 442 is supported by an upper end of a rotational shaft 444 passing through the cover part 436 for opening/closing the lower opening of the manifold 428.

For example, a magnetic fluid seal 446 is provided between the rotational shaft 444 and a hole of the cover part 436 through which the rotational shaft 444 passes, whereby the rotational shaft 444 is rotatably supported while being hermetically sealed. The rotational shaft 444 is mounted on a tip of an arm 450 supported by an elevation mechanism 448 such as a boat elevator or the like, so that the wafer boat 434, the cover part 436 and the like can be integrally raised and lowered. Furthermore, the table 442 may be fixedly installed on the cover part 436 to perform film-forming processing on the wafer W without rotating the wafer boat 434.

Moreover, a heating part (not shown) consisting of, for example, a carbon wire heater and surrounding the processing container 422 is provided on a lateral side of the processing container 422, thereby heating the processing container 422 located inside this heating unit and the wafers W within the processing container.

In addition, the mixed gas generating part 250 configured to supply the mixed gas, a reaction gas supply source 456 configured to supply a reaction gas and a purge gas supply source 458 configured to supply an inert gas as a purge gas are installed in the substrate processing apparatus 306.

The mixed gas generating part 200 is configured to connect, for example, three kinds of different gas supply sources and is connected to the injector 130d via the individual pipes 181 to 183 on which the flow rate controllers 171 to 173 and opening/closing valves 191 to 193 are installed (see FIGS. 1 to 3), and the branch pipes 221 to 223. The injector 130d hermetically passes through the manifold 428, is bent into an L-shape within the processing container 422 and then extends over an entire vertical region within the inner tube 424. A plurality of gas discharge holes 151 to 153 are formed in the injector 130d at a predetermined pitch, so that a material gas can be horizontally supplied to the wafers W supported by the wafer boat 434. The injector 130d may be made of, for example, quartz.

The reaction gas supply source 456 stores, for example, ammonia ($NH_3$) gas and is connected to a gas nozzle 464 via a pipe on which a flow rate controller and an opening/closing valve (not shown) are installed. The gas nozzle 464 hermetically passes through the manifold 428, is bent into an L-shape within the processing container 422 and then extends over the entire vertical region within the inner tube 424. A plurality of gas spraying holes 464A are formed in the gas nozzle 464 at a predetermined pitch, so that the reaction gas can be horizontally supplied to the wafers W supported by the wafer boat 434. The gas nozzle 464 may be made of, for example, quartz.

The purge gas supply source 458 stores a purge gas and is connected to a gas nozzle 468 via a pipe on which a flow rate controller and an opening/closing valve (not shown) are installed. The gas nozzle 468 hermetically passes through the manifold 428, is bent into an L-shape within the processing container 422 and then extends over the entire vertical region within the inner tube 424. A plurality of gas spraying holes 468A are formed in the gas nozzle 468 at a predetermined pitch, so that the purge gas can be horizontally supplied to the wafers W supported by the wafer boat 434. The gas nozzle 468 may be made of, for example, quartz. In addition, a rare gas such as argon (Ar) gas, helium (He) gas or the like, or an inert gas such as nitrogen gas or the like may be employed as the purge gas.

The injector 130d and the respective gas nozzles 464 and 468 are collectively provided on one side within the inner tube 424 (in the illustrated example, the gas nozzle 468 is shown at a side opposite to the injector 130d and the gas nozzles 464 due to a space problem), and a plurality of gas flowing holes 472 are formed to be arranged in a vertical direction in a sidewall of the inner tube 424 opposite to the injector 130d and the gas nozzles 464 and 468. Due to this, the gases supplied from the injector 130d and the gas nozzles 464 and 468 horizontally flow between the wafers and are guided into a gap 474 between the inner tube 424 and the outer tube 426 through the gas flowing holes 472.

An evacuation port 476 communicating with the gap 474 between the inner tube 424 and the outer tube 426 is formed on an upper side of the manifold 428, and an evacuation system 478 configured to evacuate the processing container 422 is provided at the evacuation port 476.

The evacuation system 478 has a pipe 480 connected to the evacuation port 476, and a pressure regulating valve 480B and a vacuum pump 484 are sequentially installed in the pipe 480, wherein the degree of opening of a valve body of the pressure regulating valve 480B is adjustable, so that a pressure in the processing container 422 can be adjusted by changing the degree of opening of the valve body. Accordingly, it is possible to evacuate an atmosphere in the process container 422 down to a predetermined pressure while adjusting the pressure.

Figure 15:
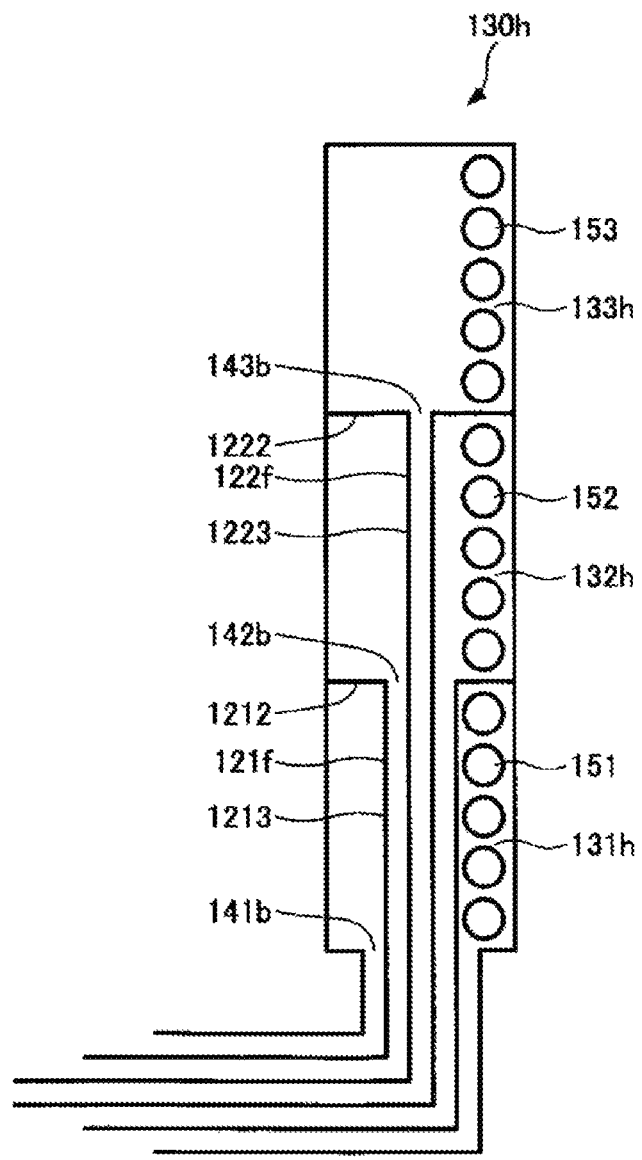
FIG. 15 is a sectional view illustrating a configuration of an example of an injector of the substrate processing apparatus according to the ninth embodiment of the present disclosure.

FIG. 15 is a sectional view illustrating a configuration of an example of an injector 130h. As shown in FIG. 15, an interior of the vertically elongated injector 130h is divided into three (3) chambers 131h to 133h by partitions 121f and 122f. No orifice is formed in the partitions 121f and 122f, so that the respective chambers 131h to 133h are completely separated from one another. The partitions 121f and 122f are composed of portions 1212 and 1222 perpendicular to the longitudinal direction of the injector 130h, and portions 1213 and 1223 parallel to the longitudinal direction, wherein the portions 1213 and 1223 parallel to the longitudinal direction concentrically extend to form the injector 130d into a triple pipe as a whole.

Like the injector 130f shown in FIG. 12, the positions of the gas introducing ports 141b to 143b of the respective chambers 131h to 133h are arranged in the longitudinal direction (vertical direction) of the injector 130h in the order of the gas introducing ports 141b, 142b and 143b from a lower position in the vertical direction.

Configurations of the gas discharge holes 151 to 153 are the same as those described above except that they are arranged in the vertical direction and face the wafers W disposed inward thereto.

As such, even in the vertical type heat treatment apparatus, a ratio of flow rates of vaporized raw materials in the vertical direction can be adjusted with a high accuracy by using the mixed gas multiple line supply system 256 according to this embodiment, thereby improving in-plane uniformity among the stacked wafers W.

<Tenth Embodiment>

Figure 16:
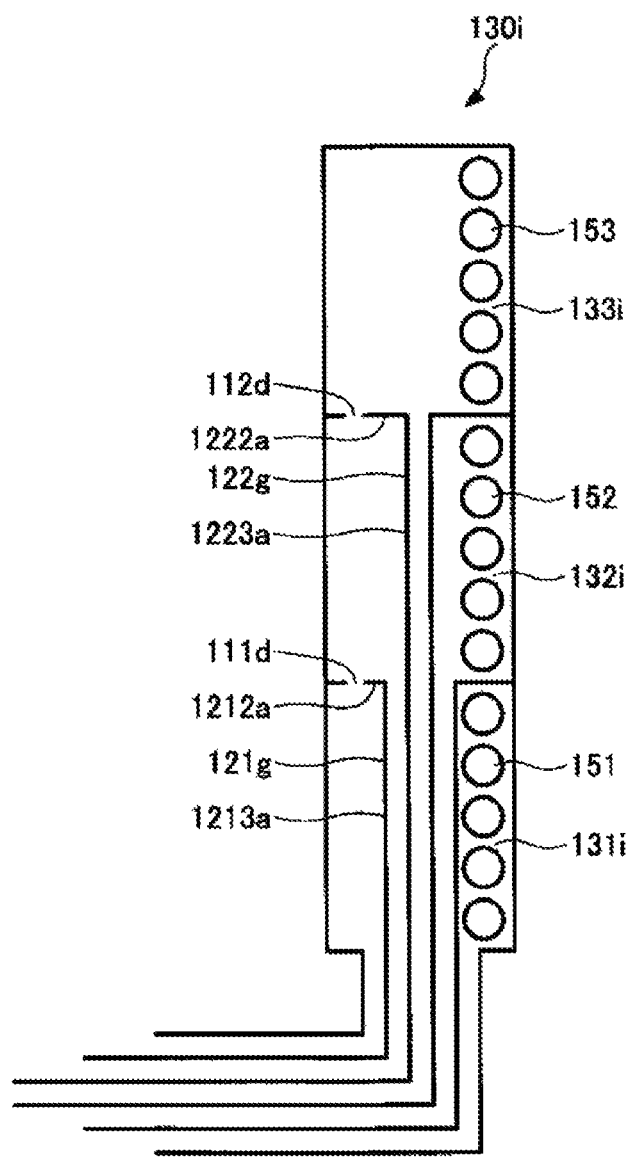
FIG. 16 is a view illustrating an example of an injector of a mixed gas multiple line supply system and a substrate processing apparatus according to a tenth embodiment of the present disclosure.

FIG. 16 is a view illustrating an example of an injector 130i of a mixed gas multiple line supply system and a substrate processing apparatus according to a tenth embodiment of the present disclosure. The mixed gas multiple line supply system and the substrate processing apparatus according to the tenth embodiment have an overall configuration that is the same as that of the mixed gas multiple line supply system 256 and the substrate processing apparatus 306 according to the ninth embodiment shown in FIG. 14, except for a configuration of the injector 130i.

The injector 130e of the substrate processing apparatus according to the tenth embodiment is different from the injector 130h of the mixed gas multiple line supply system 256 and the substrate processing apparatus 306 according to the ninth embodiment in that as shown in FIG. 16, orifices 111d and 112d are formed in portions of partitions 121g and 122g to allow the chambers 131i to 133i to communicate with one another. Moreover, the partitions 121g and 122g are composed of portions 1212a and 1222a perpendicular to the longitudinal direction of the injector 130i, and portions 1213a and 1223a parallel to the longitudinal direction, wherein the portions 1213a and 1223a parallel to the longitudinal direction concentrically extend to form the injector 130i into a triple pipe as a whole. Further, the orifices 111d and 112d are formed in the portions 1212a and 1222a perpendicular to the longitudinal direction of the injector 130i.

As such, the injector 130i may be configured such that the chambers 131i to 133i communicate with one another by forming the orifices 111d and 112d in portions of the partitions 121g and 122g. With such a configuration, it is possible to configure the injector 130i in a space-saving manner and at low costs as compared with independent installation of three separate injectors 131c to 133c, and amounts of discharge from the gas discharge holes 151 to 153 can be smoothly distributed to perform control of flow rates with a higher accuracy. In addition, if the chambers 131i to 133i are configured to communicate with one another, the positions or sizes of the orifices 111d and 112d may be adjusted according to usages thereof.

Since other components are the same as those of the mixed gas multiple line supply system 256 and the substrate processing apparatus 306 according to the ninth embodiment, descriptions thereof will be omitted.

<Eleventh embodiment>

Figure 17:
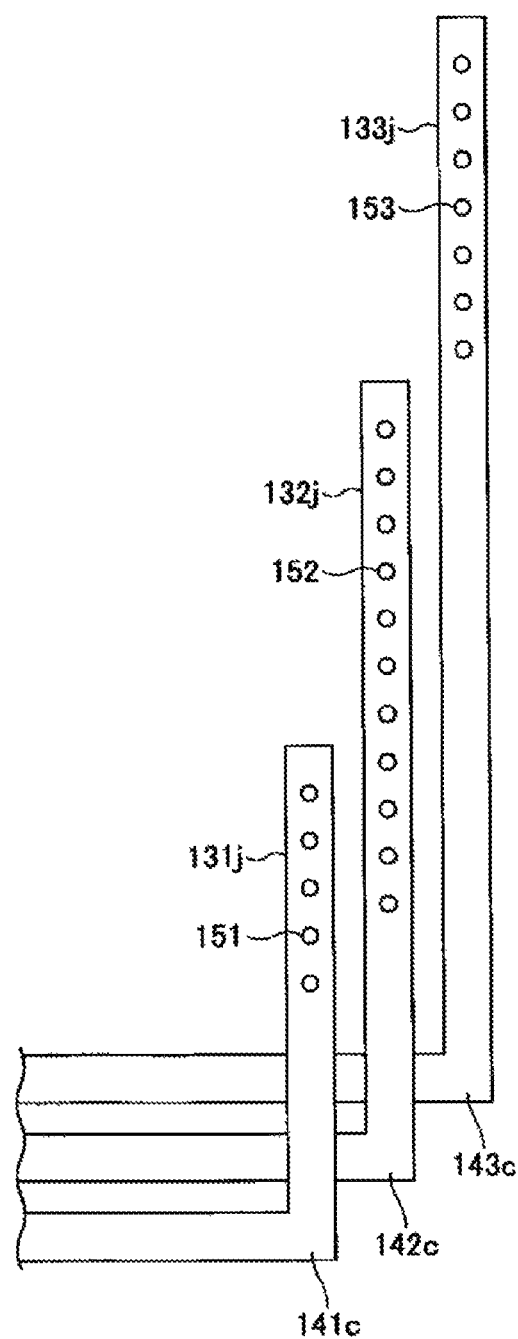
FIG. 17 is a view illustrating an example of injectors of a mixed gas multiple line supply system and a substrate processing apparatus according to an eleventh embodiment of the present disclosure.

FIG. 17 is a view illustrating an example of injectors 131j to 133j of a mixed gas multiple line supply system and a substrate processing apparatus according to an eleventh embodiment of the present disclosure. The mixed gas multiple line supply system and the substrate processing apparatus according to the eleventh embodiment have an entire configuration that is similar to that of the mixed gas multiple line supply system and the substrate processing apparatus 305 according to the ninth embodiment shown in FIG. 14. However, the mixed gas multiple line supply system and the substrate processing apparatus according to the eleventh embodiment are different from the mixed gas multiple line supply systems 256 and the substrate processing apparatuses 306 according to the ninth and tenth embodiments in that, as shown in FIG. 17, a plurality of injectors 131j to 133j configured to supply the vaporized raw material are provided and a plurality of gas discharge holes 151 to 153 are formed in the respective injectors 131j to 133j to enable the injectors 131j to 133j to supply the vaporized raw materials to different regions in the vertical direction in the processing container 422.

The branch pipes 221 to 223 branched off from the flow splitter 210 are connected to gas introducing ports 141c to 143c of the respective injectors 131j to 133j in one-to-one correspondence so as to allow the injectors 131j to 133j to supply the vaporized raw materials into the processing container 422 at individually set flow rates. It can be said that the substrate processing apparatus according to the eleventh embodiment is one obtained by applying the substrate processing apparatus 300 according to the first embodiment to a vertical type heat treatment apparatus.

As such, a plurality of completely independent injectors 131d to 133d may be used to supply the mixed gas to a plurality of regions in the processing container 422 at individually set flow rates.

As described above, the mixed gas multiple line supply system according to the embodiment of the present disclosure can use a plurality of injectors capable of supplying the mixed gas to the plurality of regions in the processing container, thereby constructing various types of substrate processing apparatuses and performing control of flow rates for the respective regions with a high accuracy so as to perform substrate processing with a higher accuracy.

In the first to eleventh embodiments, the film formation has been described by way of example. However, the substrate processing apparatuses according to the embodiments of the present disclosure may be applied to various substrate processing apparatuses so far as they employ a vaporized raw material such as an etching gas or the like. Further, the configurations of the injectors are not limited to the examples of the embodiments, but may be applied to various types of injectors.

According to the present disclosure, it is possible to reduce the number of pipes configured to supply gases, thereby resulting in miniaturization of the apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A mixed gas multiple line supply system, comprising:
   a flow splitter connected to a common mixed gas supplying passage, the flow splitter configured to split a mixed gas into a plurality of supply lines while adjusting a ratio of flow rates in the plurality of supply lines; and
   at least one injector including a gas introducing port and a gas discharge hole for each of a plurality of regions in the processing container and configured to supply the mixed gas to each of the plurality of regions,
   wherein the plurality of supply lines of the flow splitter are connected in one-to-one correspondence to the respective gas introducing ports provided for the plurality of regions in the processing container,
   wherein the at least one injector has a plurality of chambers formed therein by being divided by at least one partition,
   wherein the at least one partition is formed with a communicating hole to enable the plurality of chambers to communicate with one another, and
   wherein the at least one partition and the communicating hole includes a plurality of partitions and a plurality of communicating holes, respectively, and at least one size of one of the communicating holes is different from that of the other communicating holes.

2. The mixed gas multiple line supply system of claim 1, wherein a plurality of supplying passages and flow rate controllers configured to supply a plurality of gases constituting the mixed gas to the mixed gas supplying passage at predetermined flow rates are installed on an upstream side of the mixed gas supplying passage, such that one of the supplying passages and one of the flow rate controllers are provided for each of the gases.

3. The mixed gas multiple line supply system of claim 1, wherein the gas discharge hole comprises a plurality of gas discharge holes formed for each of the plurality of regions.

4. The mixed gas multiple line supply system of claim 3, wherein the plurality of gas discharge holes has at least one among diameters, numbers and positions which are adjusted for the plurality of regions, respectively.

5. The mixed gas multiple line supply system of claim 1, wherein the at least one injector includes a plurality of separate injectors, each of the separate injectors being independently installed for each of the plurality of regions.

6. The mixed gas multiple line supply system of claim 5, wherein the separate injectors have a region to which only one separate injector supplies the mixed gas.

7. The mixed gas multiple line supply system of claim 6, wherein the separate injectors have a region to which at least two separate injector supply the mixed gas.

8. A substrate processing apparatus, comprising:
   the mixed gas multiple line supply system of claim 1;
   a processing container; and
   a wafer holding unit configured to hold a wafer in the processing container.

9. The substrate processing apparatus of claim 8, wherein:
   the processing container has a cylindrical shape with a lateral width greater than a height,
   the wafer holding unit is a rotary table configured to hold the wafer on an upper surface thereof,
   the at least one injector is placed above the rotary table and in a radial direction of the rotary table, and
   the substrate processing apparatus further comprises a gas nozzle disposed to be spaced apart from the injector in a circumferential direction of the rotary table.

10. The substrate processing apparatus of claim 8, wherein:
    the processing container has a vertically elongated cylindrical shape,
    the wafer holding unit is a wafer boat in which a plurality of wafers can be mounted in a stacked manner, the wafers being mounted to be spaced apart from one another in a vertical direction, and
    the at least one injector is arranged to extend in a vertical direction along an inner wall surface of the processing container,
    the substrate processing apparatus further comprises a heating unit disposed to surround an outer peripheral surface of the processing container.

* * * * *